(12) United States Patent
Maegawa

(10) Patent No.: US 10,848,689 B2
(45) Date of Patent: Nov. 24, 2020

(54) INFRARED IMAGING ELEMENT DETECTING TEMPERATURE CHANGE, AND INFRARED CAMERA USING THE SAME ELEMENT

(71) Applicant: MITSUBISHI ELECTRIC CORPORATION, Chiyoda-ku (JP)

(72) Inventor: Tomohiro Maegawa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 75 days.

(21) Appl. No.: 16/082,097

(22) PCT Filed: Feb. 7, 2017

(86) PCT No.: PCT/JP2017/004434
§ 371 (c)(1),
(2) Date: Sep. 4, 2018

(87) PCT Pub. No.: WO2017/183260
PCT Pub. Date: Oct. 26, 2017

(65) Prior Publication Data
US 2020/0059610 A1    Feb. 20, 2020

(30) Foreign Application Priority Data

Apr. 19, 2016 (JP) .................. 2016-083354

(51) Int. Cl.
*H01L 27/146* (2006.01)
*H04N 5/33* (2006.01)
(Continued)

(52) U.S. Cl.
CPC ............ *H04N 5/33* (2013.01); *G01J 5/10* (2013.01); *H01L 27/14649* (2013.01); *H04N 5/378* (2013.01)

(58) Field of Classification Search
CPC ....... G01J 5/20; H04N 5/33; H01L 27/14643; H01L 27/14649
See application file for complete search history.

(56) References Cited

U.S. PATENT DOCUMENTS 5,650,622 A * 7/1997 Ookawa .................. H04N 5/33
250/332
5,757,008 A * 5/1998 Akagawa ............. H04N 3/1512
250/370.08
(Continued)

FOREIGN PATENT DOCUMENTS

EP          1953509 A1 * 8/2008 ................ G01J 5/20
JP       2002-314887 A    10/2002
(Continued)

OTHER PUBLICATIONS

Office Action dated Jun. 18, 2019 in Japanese Patent Application No. 2018-512791, 12 pages (with partial English translation).
(Continued)

Primary Examiner — Rowina J Cattungal
(74) Attorney, Agent, or Firm — Xsensus LLP

(57) ABSTRACT

An infrared imaging element includes a photosensitive pixel array and a driving line for each photosensitive pixel. The infrared imaging element includes a vertical scanning circuit, a signal line, a bias line, a differential integration circuit that time-integrates a difference between a voltage across the first constant current source and a voltage across the second constant current source; a horizontal scanning circuit; a reference pixel array that outputs a reference signal changing in accordance with a change in a temperature of photosensitive pixels; a bias generating circuit that generates a bias voltage for applying the bias voltage to the bias line, the bias voltage corresponding to a difference between a reference voltage and a differential signal between the reference signal and a voltage on the bias line; and a voltage gener-
(Continued)

ating circuit that generates a temperature signal generation voltage based on the bias voltage.

12 Claims, 15 Drawing Sheets

(51) Int. Cl.
*G01J 5/10* (2006.01)
*H04N 5/378* (2011.01)

(56) References Cited

U.S. PATENT DOCUMENTS

| | | | | |
|---|---|---|---|---|
| 6,504,155 | B1* | 1/2003 | Ookawa | H04N 5/33 250/352 |
| 8,431,900 | B2* | 4/2013 | Onakado | H04N 5/3651 250/338.4 |
| 2002/0074499 | A1* | 6/2002 | Butler | G01J 5/20 250/338.1 |
| 2003/0038332 | A1* | 2/2003 | Kimura | G01J 1/44 257/467 |
| 2004/0069929 | A1* | 4/2004 | Furukawa | H04N 5/355 250/208.1 |
| 2005/0029453 | A1* | 2/2005 | Allen | H04N 5/3655 250/332 |
| 2008/0251721 | A1* | 10/2008 | Ueno | G01J 5/08 250/332 |
| 2009/0194698 | A1* | 8/2009 | Onakado | H04N 5/33 250/338.1 |
| 2011/0210251 | A1* | 9/2011 | Onakado | H04N 5/3742 250/332 |

FOREIGN PATENT DOCUMENTS

| | | |
|---|---|---|
| JP | 2005-214639 A | 8/2005 |
| JP | 2008-185465 A | 8/2008 |

OTHER PUBLICATIONS

International Search Report dated Apr. 18, 2017 in PCT/JP2017/004434 filed Feb. 7, 2017.
Tomohiro Ishikawa, et al., "Low-cost 320×240 uncooled IRFPA using conventional silicon IC process", Part of SPIE Conference on Infrared Technology and Applications XXV, Apr. 1999, vol. 3698, pp. 556-564.
Office Action dated Aug. 19, 2020 in Chinese Patent Application No. 201780023233.5, 12 pages.

* cited by examiner

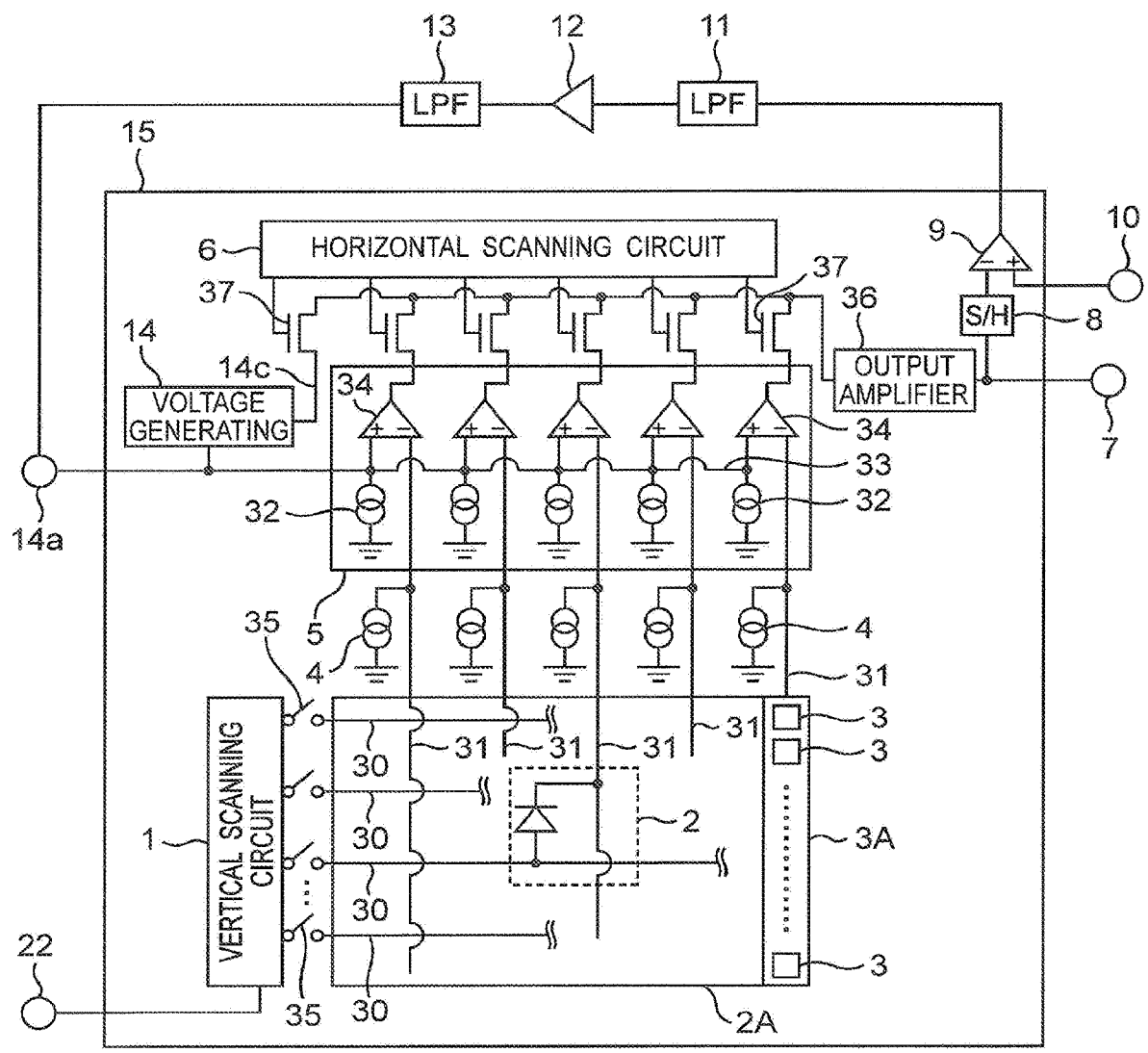

FOURTH EMBODIMENT

US 10,848,689 B2

INFRARED IMAGING ELEMENT DETECTING TEMPERATURE CHANGE, AND INFRARED CAMERA USING THE SAME ELEMENT

TECHNICAL FIELD

The present invention relates to an infrared imaging element that detects a temperature change due to, for example, incident infrared rays, by a two-dimensionally arranged semiconductor sensor, and particularly relates to an infrared imaging element that integrates electric signals from a semiconductor sensor by a signal processing circuit, and outputs the integrated signals. In addition, the present invention relates to an infrared camera using the above infrared imaging element.

BACKGROUND ART

In general thermal infrared solid-state imaging elements, pixels having a heat insulating layer are two-dimensionally arranged, and an infrared image is captured by utilizing the fact that a temperature of the pixel changes due to incident infrared rays. In a case of an uncooled thermal infrared solid-state imaging element, there is known a temperature sensor, which configures a pixel, using a semiconductor element such as a diode or transistor, besides a bolometer such as polysilicon, amorphous silicon, silicon carbide, or vanadium oxide. In particular, a semiconductor element such as a diode is advantageous in making the characteristics of each of pixels uniform, since variations in electrical characteristics and temperature dependency are very small between individual elements.

In addition, in the thermal infrared solid-state imaging element, the pixels are two-dimensionally arranged, connected by a driving line for each of rows, and connected by a signal line for each of columns. Each of driving lines is sequentially selected by a vertical scanning circuit and a switch, and the pixel is energized from a power supply via the selected driving line. An output of the pixel is transmitted to an integration circuit via the signal line, integrated and amplified by the integration circuit, and output to the output terminal sequentially by a horizontal scanning circuit and a switch (for example, see Non-Patent Document 1).

In these thermal infrared solid-state imaging elements, in addition to the voltage across the pixel, a voltage drop in the driving line affects the voltage inputted to the integration circuit. However, since an amount of voltage drop in the driving line differs for each of pixel columns, the output of the integration circuit also has a different value for each of pixel columns, resulting in generation of an offset distribution in a captured image due to a resistance of the driving line. In addition, a response to infrared light of the thermal infrared solid-state imaging element, that is, a change in the voltage across the pixel is much smaller than a voltage drop component in the driving line. For this reason, saturation or the like occurs in the amplifier due to a voltage drop distribution due to the driving line, and there is also such a problem that a necessary degree of amplification cannot be secured.

In addition, a response of a pixel includes a response due to element temperature change in addition to a response of infrared light, resulting in such a problem that an element output drifts with a change in an element temperature. That is, while completely heat-insulating the pixel and detecting only the temperature change due to infrared ray absorption are ideal, since a heat insulating layer of the pixel has a finite thermal resistance, the output also changes when an ambient temperature changes during a detection operation. Since output fluctuation due to a change in an ambient temperature cannot be distinguished from a change in incident infrared rays, measurement accuracy of the infrared rays declines, disabling stable image acquisition.

In order to solve such a problem, Patent Document 1 adopts the following configuration.

(1) A differential integration circuit is used for an integration circuit.

(2) A bias line parallel to a driving line is provided, a resistance of the bias line is set to be substantially the same as the driving line, and a current source to supply substantially the same current as a pixel current source for each of pixel lines of the bias lines is provided.

(3) A voltage across the pixel current source and a voltage across the current source connected to the bias line are inputted to an input of the differential integration circuit.

(4) A reference signal output circuit configured to output an output according to element temperature change is provided, and an output level stabilized voltage obtained by comparing its output with a reference power supply is generated and applied to the bias line via a low-pass filter or a buffer.

Since resistances of the bias line and the driving line are substantially the same, voltage drop amounts in the bias line and the driving line are substantially the same. That is, the voltage drop distribution due to the driving line resistance is subtracted by the differential integration circuit and is not output to the outside. Further, since the voltage applied to the bias line is generated based on the reference signal output circuit that outputs a signal output change with respect to element temperature fluctuation of the pixel, a drift due to element temperature fluctuation is also subtracted by the differential integration circuit and is not outputted to the outside.

However, the above countermeasure cannot suppress output fluctuation due to element temperature fluctuation caused by minute characteristic variations for each of pixels, read columns, and rows. In order to solve such a problem, Patent Document 2 adopts the following configuration.

(1) A temperature sensor is installed inside an imaging element.

(2) The output from an element is controlled by setting a bias voltage that will give an appropriate outputted from a temperature signal component, and pixel information is acquired by an analog/digital converter (hereinafter, analog/digital conversion is referred to as A/D conversion).

(3) Simultaneously, temperature signal information is acquired by an A/D converter separately provided from that for the image acquisition.

(4) Based on the temperature information, a correction value is determined from a lookup table acquired in advance and used for stabilizing an image.

PRIOR ART DOCUMENTS

Patent Documents

[Patent Document 1] Japanese Patent Laid-open Publication No. 2005-214639
[Patent Document 2] Japanese Patent Laid-open Publication No. 2002-314887

Non-Patent Document

[Non-Patent Document 1] Ishikawa et al., "Low Cost 320× 240 Uncooled IRFPA Using Conventional Silicon IC Process", Part of the SPIE Conference on Infrared Technology and Applications XXV, published in April 1999, Vol. 3698, pp. 556 to 564

SUMMARY OF THE INVENTION

Problems to be Solved by the Invention

However, an infrared imaging element of Patent Document 1 has a mechanism in which an output level stabilized voltage that keeps the pixel signal level at a constant level is generated and fed back as an element bias, and the pixel signal does not include substrate temperature information. When acquiring substrate temperature information, it is necessary to read the output level stabilized voltage by the A/D converter. Therefore, adding this mechanism raises the risk of increase in a noise component, and the same time, an A/D converter and an information acquisition mechanism are required separately from that for image information acquisition, resulting in an increase in power consumption and an increase in circuit scale. In addition, an A/D converter having a large number of bits for A/D conversion is required for acquiring accurate temperature information, resulting in a problem of increasing the cost.

In addition, acquiring accurate temperature information requires that temperature information in an element, more preferably, in a pixel array is a signal component as temperature information. More preferably, it is preferable to acquire temperature information at a timing when a pixel is operating, that is, at a timing of reading out the temperature information.

An object of the present invention is to provide an infrared imaging element that can solve the above problems and can acquire temperature information at low cost with a circuit configuration simpler than that of the prior art, and to provide an infrared camera provided with the infrared imaging element.

Means for Dissolving the Problems

According to one aspect of the present invention, there is provided an infrared imaging element, and the infrared imaging element includes a photosensitive pixel array having a heat insulating layer and an infrared ray absorption member, the photosensitive pixel array including a plurality of photosensitive pixels arranged in a two-dimensional shape; a driving line commonly connected with one pole of each of the photosensitive pixels for each of rows; a vertical scanning circuit that sequentially selects the driving line to connect the driving line to a power supply; a signal line commonly connected with another pole of each of the photosensitive pixels for each of columns, the signal line having an end part connected with first constant current source means; a bias line that is connected in parallel with second constant current source means provided for each of the columns of the photosensitive pixel array, the bias line generating a voltage drop substantially identical to that of the driving line; a differential integration circuit provided for each of the columns of the photosensitive pixel array, the differential integration circuit time-integrating and outputting a difference between a voltage across the first constant current source means and a voltage across the second constant current source means with a predetermined integration time; and a horizontal scanning circuit that selects an output signal of the differential integration circuit for each of the columns to guide the output signal to an image signal output terminal as an image signal. The infrared imaging element further includes: a reference pixel array that outputs a reference signal that changes substantially in accordance with a change in a temperature of a whole of the plurality of photosensitive pixels; a bias generating circuit that generates a bias voltage for applying the bias voltage to the bias line, the bias voltage corresponding to a difference between a predetermined reference voltage and a differential signal between the reference signal and a voltage at a predetermined position on the bias line, and the bias voltage including a voltage component of an output level stabilized voltage; and a voltage generating circuit that generates a predetermined temperature signal generation voltage based on the bias voltage, and adds the predetermined temperature signal generation voltage to the image signal output terminal.

Effect of the Invention

Therefore, according to the present invention, it is possible to generate an image signal including a temperature signal generation voltage. Therefore, for example, it is possible to acquire temperature information by the A/D converter same as that for acquisition of an image signal, resulting in neither an increase in power consumption nor an increase in circuit scale. At the same time, both the image information and the temperature information are outputted, facilitating various image corrections in an image signal processing circuit in a subsequent stage.

BRIEF DESCRIPTION OF THE DRAWINGS

FIG. 1 is a circuit diagram showing a configuration example of a thermal infrared solid-state imaging element according to a first embodiment of the present invention.

MODE FOR CARRYING OUT THE INVENTION

Figure 2A:
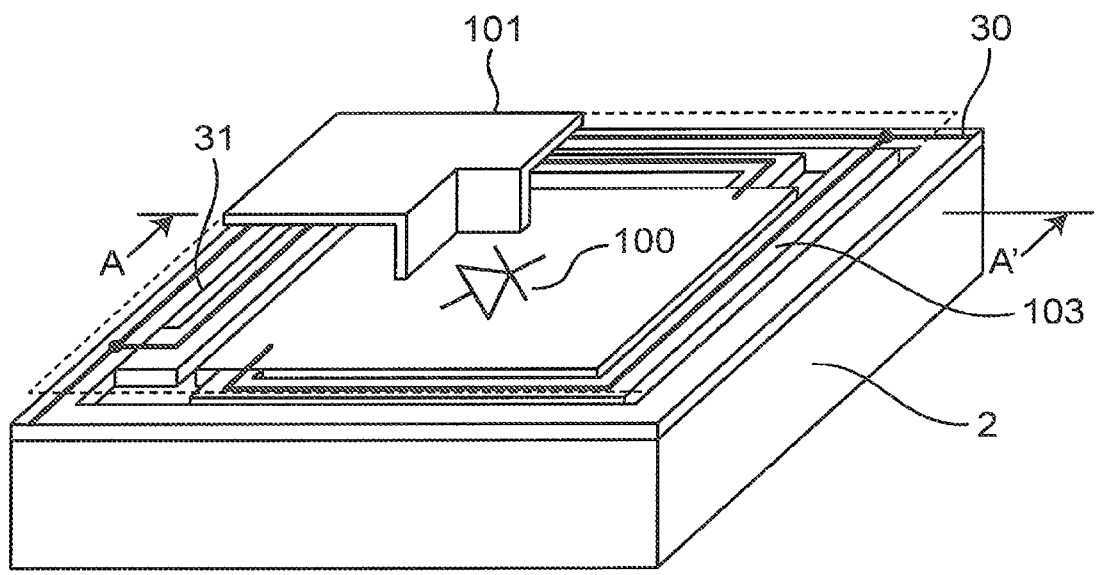
FIG. 2A is a perspective view showing an appearance of a photosensitive pixel 2 of FIG. 1.

Hereinafter, embodiments of the present invention will be described with reference to the drawings. It should be noted that, in each of the following embodiments, the same components are denoted by the same reference numerals.

First Embodiment

Figure 2B:
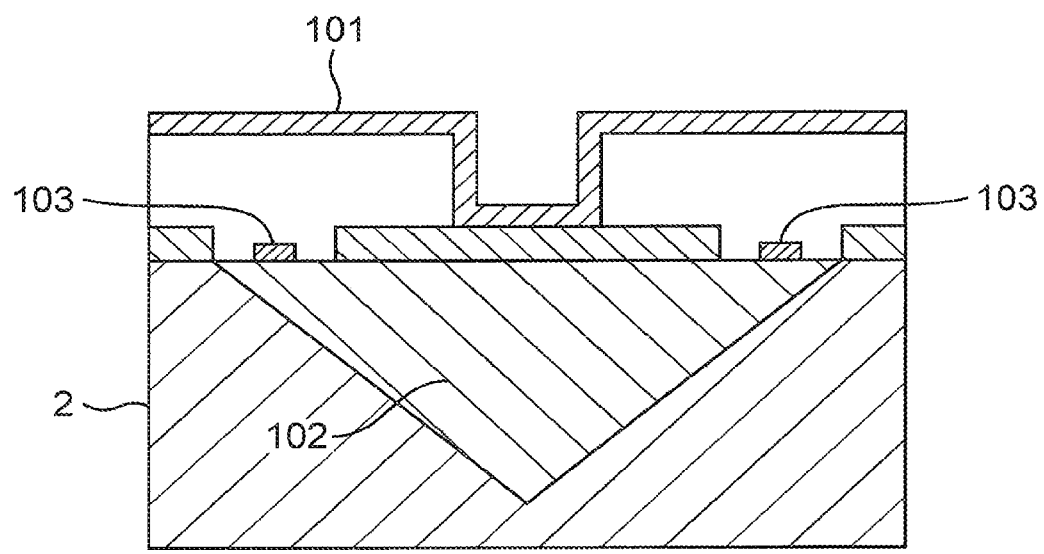
FIG. 2B is a longitudinal cross-sectional view taken along line A-A' of FIG. 2A.

FIG. 1 is a circuit diagram showing a configuration example of a thermal infrared solid-state imaging element according to a first embodiment of the present invention. In addition, FIG. 2A is a perspective view showing an appearance of a photosensitive pixel 2 of FIG. 1, and FIG. 2B is a longitudinal cross-sectional view taken along line A-A' of FIG. 2A.

Referring to FIG. 1, the thermal infrared solid-state imaging element according to the first embodiment is a configured such that, in a manner similar to that of a thermal infrared solid-state imaging element according to the prior art, a plurality of photosensitive pixels 2 are arranged in a lattice shape in a two-dimensional shape so as to form a photosensitive pixel array 2A. In this case, each of photosensitive pixels 2 is configured to include a plurality (which may be at least one) of diodes 100 connected in series. As shown in FIGS. 2A and 2B, the photosensitive pixel 2 is formed by forming a supporting leg 103 on a heat insulating layer 102, and forming an infrared ray absorption member 101 on the supporting leg 103.

A driving line 30 is commonly connected for each of rows of a predetermined number of the photosensitive pixels 2, while a signal line 31 is commonly connected for each of columns of a predetermined number of the photosensitive pixels 2. An end of each of signal lines 31 is connected with a first constant current source 4 as a first group of constant current source means, and also connected to an inverting input terminal of a differential integration circuit 34. In addition, the driving line 30 is sequentially selected by a vertical scanning circuit 1 and a plurality of vertical selection switches 35, and each of driving lines 30 is sequentially connected to a power supply terminal 22. On the other hand, for each of columns of the photosensitive pixels 2 in proximity to the first constant current source 4, there is disposed, as a second group of constant current source means, a second constant current source 32 configured to allow substantially the same current as the first constant current source 4 to flow, and a plurality of the second constant current sources 32 are connected in parallel by a bias line 33 that is substantially parallel to the driving line 30. The bias line 33 has substantially the same resistance value as that of the driving line 30 to generate a voltage drop substantially the same as that of the driving line 30, and is connected to a non-inverting output terminal of each of differential integration circuits 34.

It should be noted that, it is sufficient that the bias line 33 has substantially the same voltage effect as that of the driving line 30, and does not necessarily have the same resistance as that of the driving line 30. When a current value of the first constant current source 4 is different from that of the second constant current source 32, the bias line 33 and the driving line 30 may have different resistances, accordingly.

The differential integration circuit 34 is provided for each of rows of the photosensitive pixels 2, and the differential integration circuit 34 time-integrates and amplifies a difference between a voltage across the first constant current source 4 and a voltage across the second constant current source 32 with a predetermined integration interval. A signal voltage of the pixel signal resulting from the integration and amplification is outputted via an output amplifier 36 and a plurality of horizontal selection switches 37 configured to include, for example, transistors. In this case, the plurality of horizontal selection switches 37 are sequentially turned ON by a horizontal scanning circuit 6, and an output signal of the differential integration circuit 34 arranged for each of columns is outputted as a pixel signal to an external circuit from an image signal output terminal 7 via the output amplifier 36. Since substantially the same voltage drop as that of the driving line 30 occurs in the bias line 33, the voltage drop in the driving line 30 is canceled from the output voltage by the above configuration, and an offset distribution derived from the driving line 30 is removed.

Next, a method of determining an output level stabilized voltage 14a according to the prior art will be described below.

The differential integration circuit 34 at the right end of FIG. 1 generates a differential signal between a voltage of the bias line 33 and a reference signal that reflects an element temperature and is outputted from a reference pixel 3 of a reference pixel array 3A (reference signal output circuit) provided in the photosensitive pixel array 2A or outside the photosensitive pixel array 2A. Further, via the output amplifier 36 and a sample-and-hold circuit 8, the differential integration circuit 34 outputs the differential signal to the inverting input terminal of a bias generating circuit 9 that is configured to include a differential amplifier circuit. The bias generating circuit 9 compares the differential signal with a predetermined reference voltage 10, generates a bias voltage corresponding to the difference, and feeds back to the bias line 33 via a low-pass filter 11, a buffer amplifier 12, and a low-pass filter 13. With the loop circuit described above, it is possible to automatically correct voltage variation of the bias line due to manufacturing variations or the like while changing the voltage of the bias line 33 according to the reference signal (that is, according to the element temperature).

Next, a structure of the reference pixel array 3A will be described below.

FIGS. 3A to 3E are longitudinal cross-sectional views showing a configuration of the reference pixel 3 of FIG. 1 according to the first to fifth implementation examples, respectively. In this case, the reference pixel 3 is formed by removing at least one of the heat insulating layer 102 and the infrared ray absorption member 101 from the photosensitive pixel 2, or adding an infrared ray shielding layer 104. It should be noted that the structure of the reference pixel array 3A of FIGS. 3A to 3E may be applied to other embodiments and their modified embodiments other than the first embodiment.

Figure 3A:
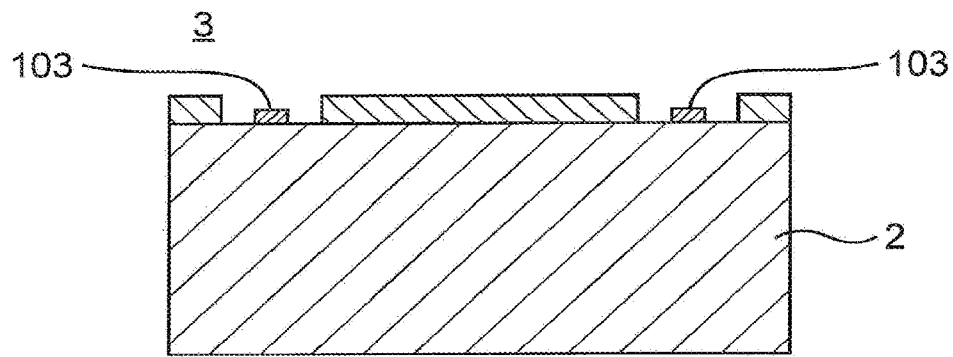
FIG. 3A is a longitudinal cross-sectional view showing a configuration of a reference pixel 3 of FIG. 1 according to a first implementation example.
Figure 3B:
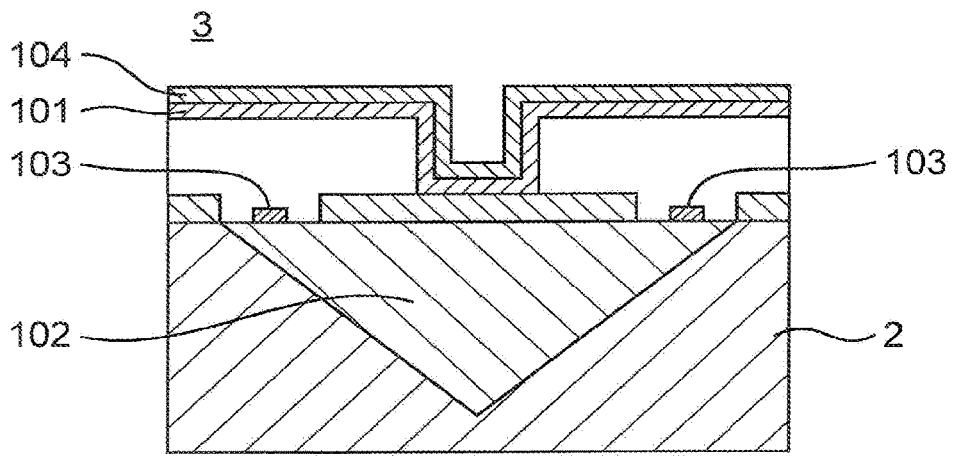
FIG. 3B is a longitudinal cross-sectional view showing a configuration of a reference pixel 3 of FIG. 1 according to a second implementation example.
Figure 3C:
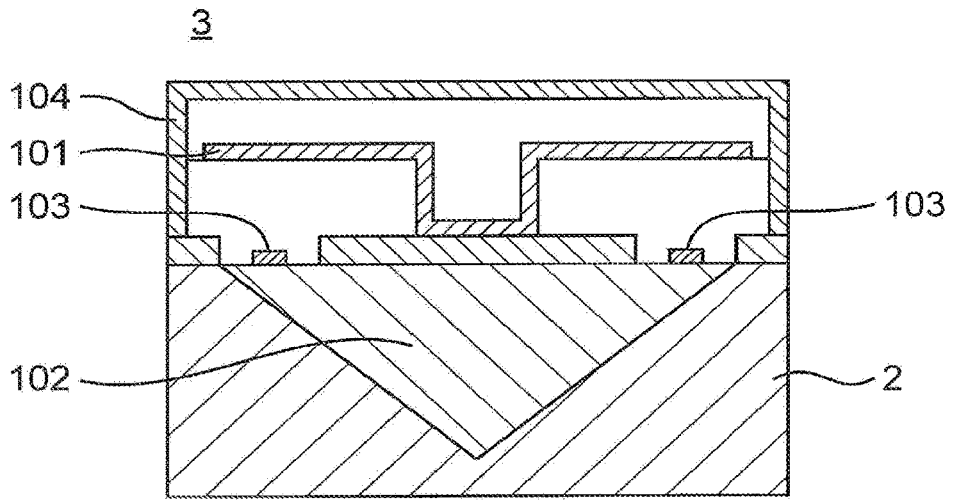
FIG. 3C is a longitudinal cross-sectional view showing a configuration of a reference pixel 3 of FIG. 1 according to a third implementation example.

For example, as shown in FIG. 3A, the reference pixel 3 may be formed by removing the infrared ray absorption member 101 and the heat insulating layer 102 from the structure of FIGS. 2A and 2B. In addition, as shown in FIG. 3B, the reference pixel 3 may be formed by merely adding the infrared ray shielding layer 104 directly to the infrared ray absorption member 101 in the structure of FIGS. 2A and 2B. Further, as shown in FIG. 3C, the reference pixel 3 may be formed such that the infrared ray shielding layer 104 covers the entire pixel with respect to the structure of FIGS. 2A and 2B.

Figure 3D:
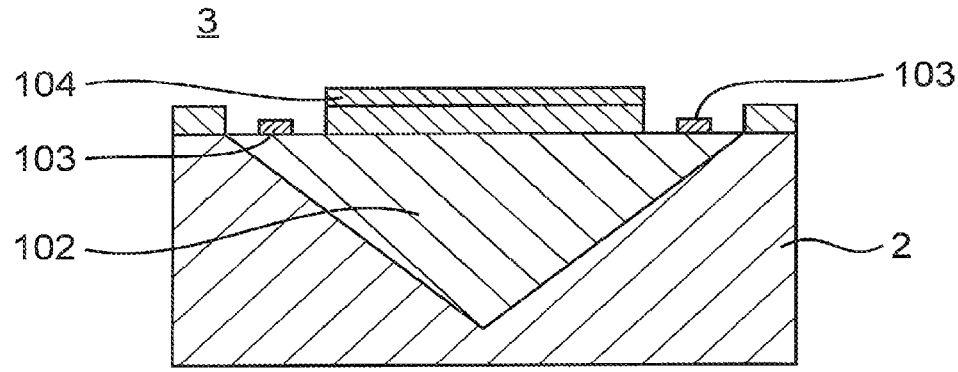
FIG. 3D is a longitudinal cross-sectional view showing a configuration of a reference pixel 3 of FIG. 1 according to a fourth implementation example.
Figure 3E:
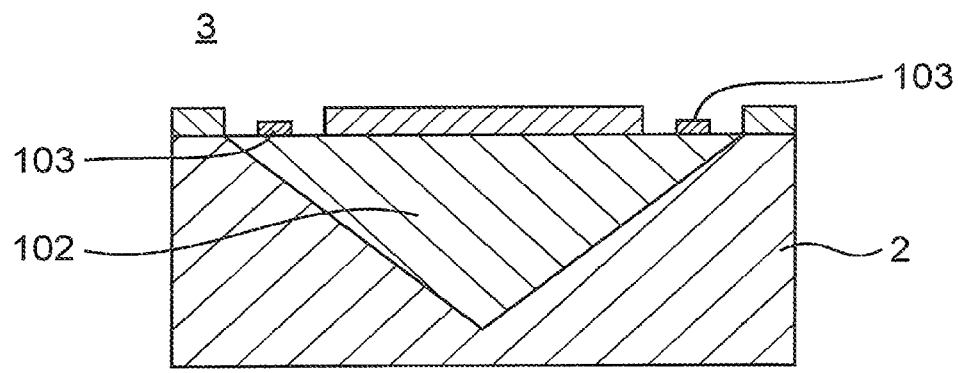
FIG. 3E is a longitudinal cross-sectional view showing a configuration of a reference pixel 3 of FIG. 1 according to a fifth implementation example.

In addition, as shown in FIG. 3D, the reference pixel 3 may be formed by removing the infrared ray absorption member 101 and forming the infrared ray shielding layer 104 in the structure of FIGS. 2A and 2B. In this case, when an infrared ray absorption rate can be sufficiently neglected by simply removing the infrared ray absorption member 101, the reference pixel 3 may be formed with the structure shown in FIG. 3E. That is, as shown in FIG. 3E, the reference pixel 3 is formed by removing the infrared ray absorption member 101 from the structure of FIGS. 2A and 2B. Alternatively, a filter that inhibits incoming infrared rays may be installed on a front face of the thermal infrared solid-state imaging element (upper side on the plane of drawing of FIG. 1).

Referring to FIG. 1, a voltage across the first constant current source 4 connected to the reference pixel 3 is read out as a reference signal. This reference signal is read out in a manner similar to that of a path of a normal output signal of the photosensitive pixel 2. That is, the voltage across the first constant current source 4 connected to the reference pixel 3 is inputted to the inverting input terminal of the differential integration circuit 34 at the right end of FIG. 1, the voltage across the second constant current source 32 that is adjacent to the differential integration circuit 34 and connected to the bias line 33 is inputted to a non-inverting input terminal of the differential integration circuit 34. This differential integration circuit 34 integrates, amplifies, and outputs the difference between the two input voltages. The output signal is read out as an output signal corresponding to the reference pixel 3 for each of lines of normal image reading by the horizontal scanning circuit 6 and the horizontal selection switch 37, and is outputted from the image signal output terminal 7 via the output amplifier 36.

The sample-and-hold circuit 8 is connected to the image signal output terminal 7, and the sample-and-hold circuit 8 samples and holds the output signal of the reference pixel 3. Then, the sampled and held signal voltage is inputted to the inverting input terminal of the bias generating circuit 9 configured to include a differential amplifier circuit, while the reference voltage 10 is inputted to the non-inverting input terminal of the bias generating circuit 9. The bias generating circuit 9 generates and outputs a bias voltage corresponding to the difference between the two input voltages. The generated bias voltage is generated as the output level stabilized voltage 14a via the low-pass filter 11, the buffer amplifier 12, and the low-pass filter 13, and the output level stabilized voltage 14a is applied to the bias line 33.

In this case, the sample-and-hold circuit 8 samples and holds the output signal of the reference pixel 3. At this time, the bias voltage may be determined by sampling and holding an output voltage of one pixel per screen. Alternatively, an output voltage of a plurality of pixels per screen may be averaged by sampling and holding.

In this case, a subtractive polarity of the differential integration circuit 34 and a subtractive polarity of the bias generating circuit 9 are selected in such a direction that a change in the output signal corresponding to the reference pixel 3 is suppressed. That is, when a voltage of the bias line 33 (a voltage of the current source 32 connected to the bias line 33) is inputted to the non-inverting input terminal of the differential integration circuit 34, an output voltage from the differential integration circuit 34 is inputted to the inverting input terminal of the bias generating circuit 9. Conversely, when the voltage of the bias line 33 is input to the inverting input terminal of the differential integration circuit 34, the output voltage of the differential integration circuit 34 is inputted to the non-inverting input terminal of the bias generating circuit 9. As a result, the bias generating circuit 9 changes the voltage of the bias line 33 into a direction to decrease this difference according to the difference between the sampled and held signal voltage and the reference voltage 10.

In the thermal infrared solid-state imaging element according to the prior art, the output level stabilized voltage 14a is directly applied to the bias line 33 via the low-pass filter 11, the buffer amplifier 12, and the low-pass filter 13. Since the output level stabilized voltage 14a maintains the signal level of the reference pixel 3 at a constant level, the pixel signal does not include the substrate temperature information, while the output level stabilized voltage 14a includes the temperature signal. When acquiring the output level stabilized voltage 14a as the substrate temperature information, it is necessary to read the bias voltage by the A/D converter, which raises the risk of increase in a noise component in this mechanism, and at the same time, an A/D converter and an information acquisition mechanism are required separately from that for image information acquisition, resulting in an increase in power consumption and an increase in circuit scale. In addition, an A/D converter having a large number of bits for A/D conversion is required for acquiring accurate temperature information, resulting in a problem of increasing the cost.

As means to solve these problems, the thermal infrared solid-state imaging element of the present embodiment applies the output level stabilized voltage 14a to a voltage generating circuit 14, and the voltage generating circuit 14 generates and outputs a voltage component of a temperature signal generation voltage 14c so as to be added to the image signal output terminal 7 via the horizontal selection switch 37 and the output amplifier 36.

Figure 4:
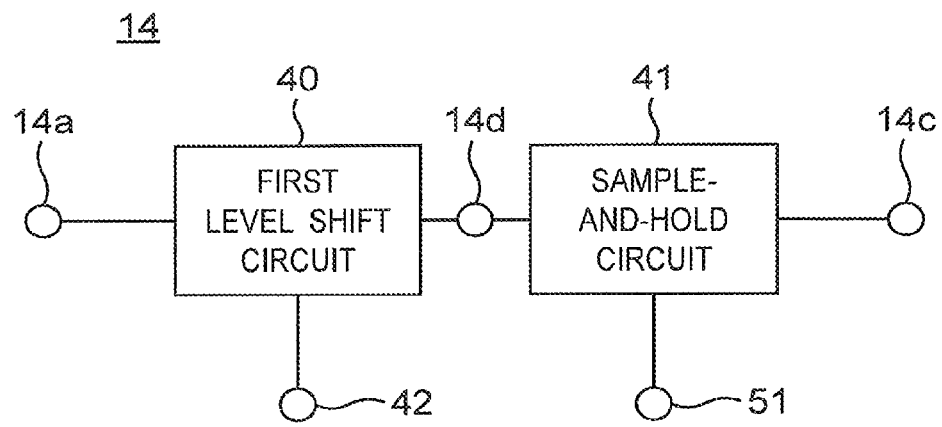
FIG. 4 is a circuit diagram showing a configuration example of a voltage generating circuit 14 of FIG. 1.
Figure 11:
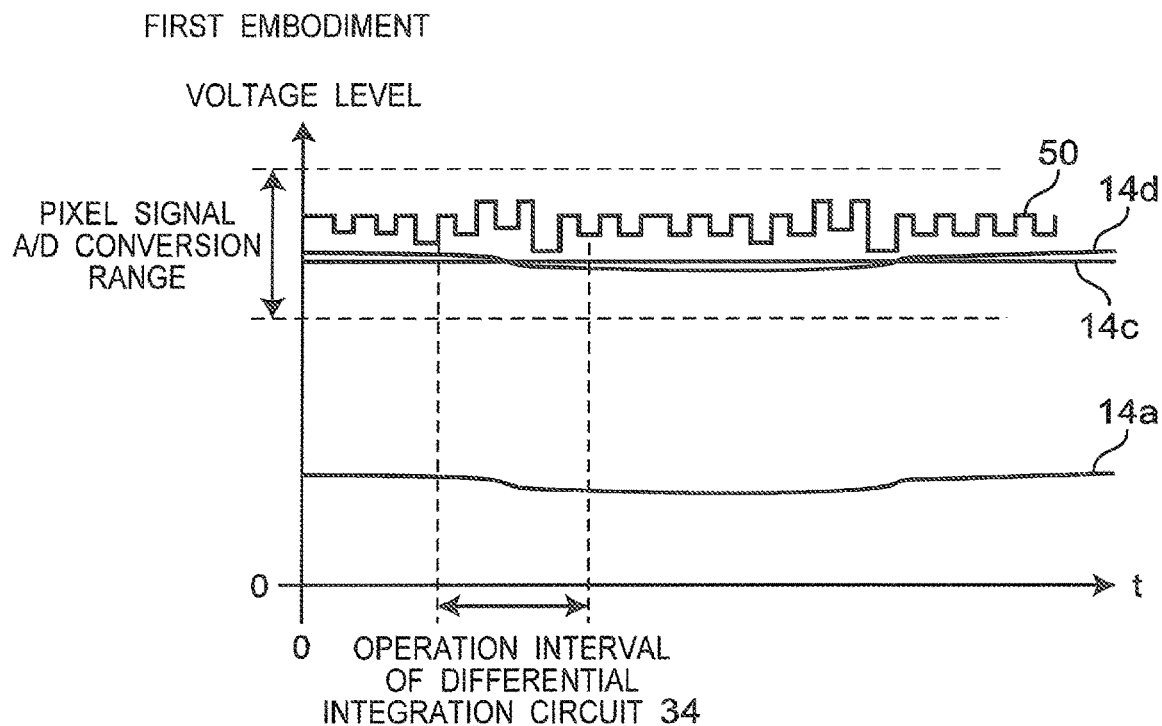
FIG. 11 is a schematic waveform chart showing a voltage level of each of terminals of the voltage generating circuit 14 of FIG. 4.

FIG. 4 is a circuit diagram showing a configuration example of the voltage generating circuit 14 of FIG. 1. In addition, FIG. 11 is a schematic waveform chart showing a voltage level of each of terminals of the voltage generating circuit 14 of FIG. 4.

The output level stabilized voltage 14a changes in accordance with a substrate temperature. The substrate temperature is strongly influenced by an ambient temperature and is also influenced by slight temperature changes such as an element operation cycle. Therefore, when acquiring the substrate temperature, it is preferable to acquire temperature information during an operation interval of the differential integration circuit 34, that is, a pixel operation interval. In addition, in FIG. 11, a signal voltage of a pixel signal 50 is set within an output A/D conversion range of the pixel signal, whereas the output level stabilized voltage 14a is not necessarily set in this pixel signal output A/D conversion range.

Referring to FIG. 4, a first level shift circuit 40 converts the output level stabilized voltage 14a into a first generated voltage 14d, and outputs to a sample-and-hold circuit 41 so as to level-shift the output level stabilized voltage 14a within the pixel signal A/D conversion range at the image signal output terminal 7. At this time, in order to define a level shift amount, a level shift amount adjustment voltage 42 may be inputted to the first level shift circuit 40. The sample-and-hold circuit 41 samples and holds the input first generated voltage 14d in an operation interval according to an operation interval signal 51 indicating the operation interval of the differential integration circuit 34, to generate the temperature signal generation voltage 14c. This enables acquisition of the substrate temperature in synchronization with a timing of acquiring the pixel signal.

Figure 12:
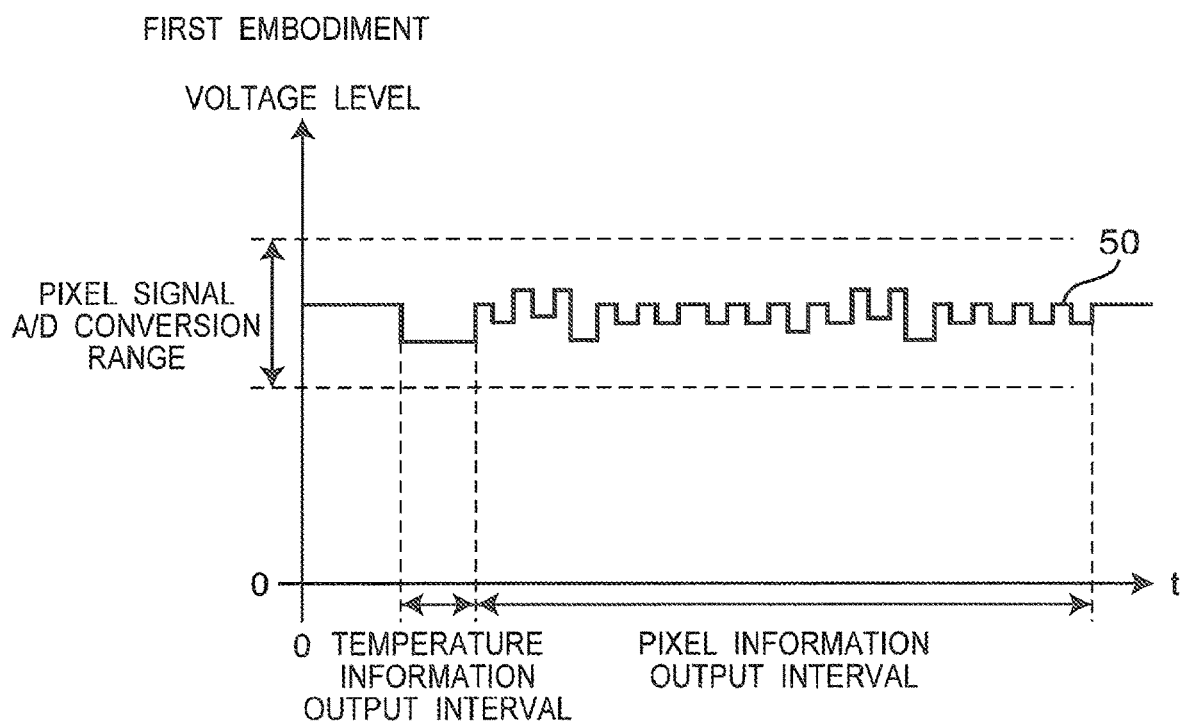
FIG. 12 is a schematic waveform chart showing an output voltage of the voltage generating circuit 14 of FIG. 4.

FIG. 12 is a schematic waveform chart showing an output voltage of the voltage generating circuit 14 of FIG. 4. Referring to FIG. 1, by applying the temperature signal generation voltage 14c to the horizontal selection switch 37, and turning ON the horizontal selection switch 37 upon receiving a control signal from the horizontal scanning circuit 6, the temperature signal generation voltage 14c is outputted to the image signal output terminal 7. That is, the temperature signal generation voltage 14c and the pixel signal are applied on the same signal as the pixel signal 50 at different timings.

It should be noted that the voltage generating circuit 14 of FIG. 1 is not limited to the above circuit configuration, as long as the stabilized voltage 14a is level-shifted within a pixel signal output range, and temperature information synchronized with a temperature signal acquisition interval can be acquired.

According to this approach, the newly provided voltage generating circuit 14 generates a temperature signal generation voltage with the output level in the same range as that of the pixel signal. Outputting this temperature signal generation voltage to the image signal output terminal 7 enables acquisition of temperature information by the A/D converter same as that for image acquisition, which does not result in an increase in power consumption and an increase in circuit scale. In addition, at the same time, since temperature information can be acquired at the timing when the pixel is operating, that is, the temperature information is being read out in the pixel array, accurate acquisition of the temperature information becomes possible.

As described above, according to the infrared imaging element of the first embodiment, the infrared imaging element includes: the photosensitive pixel array 2A having the heat insulating layer 102 and the infrared ray absorption member 101, and having the plurality of photosensitive pixels 2 arranged in a two-dimensional shape; the driving line 30 commonly connected with one pole of each of the photosensitive pixels 2 for each of rows; the vertical scanning circuit 1 configured to sequentially select the driving line 30 and connect the driving line 30 to a power supply; the signal line 31 commonly connected with another pole of each of the photosensitive pixels 2 for each of columns, and having an end part connected with the first constant current source 4; the bias line 33 that is connected in parallel with the second constant current source 32 provided for each of columns of the photosensitive pixel array 2A, and generates substantially the same voltage drop as that of the driving line 30; the differential integration circuit 34 that is provided for each of columns of the photosensitive pixel array 2A, and time-integrates and outputs a difference between a voltage across the first constant current source 4 and a voltage across the second constant current source 32 with a predetermined integration time; and the horizontal scanning circuit 6 that selects the output signal of the differential integration circuit 34 for each of columns and guides the output signal to the image signal output terminal 7 as an image signal. In this case, the infrared imaging element includes: the reference pixel array 3A that outputs a reference signal that changes substantially in accordance with a change in a temperature of the whole of the plurality of photosensitive pixels 2; the bias generating circuit 9 configured to generate a bias voltage to apply the bias voltage to the bias line, the bias voltage corresponding to a difference between a predetermined reference voltage and a differential signal between the reference signal and a voltage at a predetermined position on the bias line, and the bias voltage including a voltage component of the output level stabilized voltage; and the voltage generating circuit 14 configured to generate a predetermined temperature signal generation voltage based on the bias voltage, and to add the generated temperature signal generation voltage to the image signal output terminal.

Therefore, the newly provided voltage generating circuit 14 generates a temperature signal generation voltage with the output level in the same range as that of the pixel signal. Applying this temperature signal generation voltage to the image signal output terminal 7 enables acquisition of temperature information by the A/D converter 16a (FIGS. 9 and 10) same as that for image signal acquisition, which does not result in an increase in power consumption and an increase in circuit scale. At the same time, the image information and the temperature information are synchronously output, facilitating various corrections of the image signal in the image signal processing circuit in a subsequent stage.

In this case, preferably, the reference pixel array 3A is formed to remove either one or both of the heat insulating layer 102 and the infrared ray absorption member 101, or is formed to have the infrared ray shielding layer 104.

In addition, preferably, the photosensitive pixel array 2A is formed to remove either one or both of the heat insulating layer 102 and the infrared ray absorption member.

Further, preferably, the reference pixel array 3A is formed so as to be adjacent to at least one side in a vertical direction or a horizontal direction of the photosensitive pixel array 2A.

Furthermore, preferably, the reference pixel array 3A includes a plurality of reference pixels 3, and the infrared imaging element further includes the sample-and-hold circuit 8 that is provided in a preceding stage of the bias generating circuit 9, samples and holds pixel signals from the plurality of reference pixels 3 after averaging the pixel signals, and then outputs the sampled and held pixel signals to the bias generating circuit 9. Therefore, averaging the output signals from the plurality of reference pixels 3 enables stabilization of an output level stabilized voltage 14b, which consequently provides a stabilized output level of the image signal.

In addition, the temperature signal generation voltage 14c is adjusted so as to become a predetermined voltage together with the voltage level of the image signal, and is configured to be added to the image signal at a timing different from that of the pixel signal.

Second Embodiment

Figure 5:
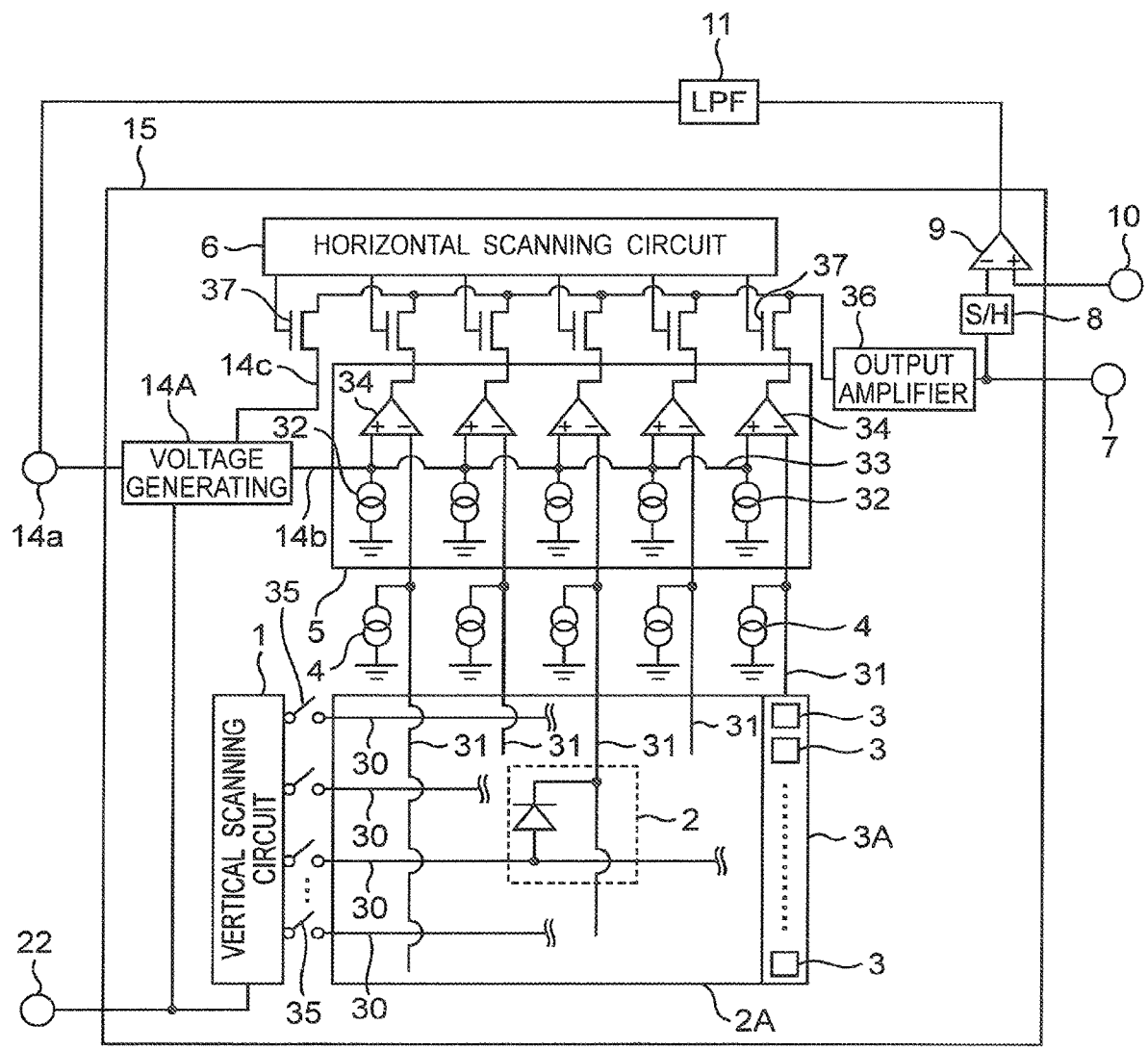
FIG. 5 is a circuit diagram showing a configuration example of a thermal infrared solid-state imaging element according to a second embodiment of the present invention.

FIG. 5 is a circuit diagram showing a configuration example of a thermal infrared solid-state imaging element according to a second embodiment of the present invention. The thermal infrared solid-state imaging element according to the second embodiment of FIG. 5 differs from the thermal infrared solid-state imaging element according to the first embodiment of FIG. 1 in the following points.

(1) A bias voltage generated by the same method as that in the first embodiment is generated from a bias generating circuit 9 as an output level stabilized voltage 14a via a low-pass filter 11 that low-pass filters an input voltage, and the output level stabilized voltage 14a is inputted to a voltage generating circuit 14A.

(2) In this circuit, two types of voltages, i.e., a temperature signal generation voltage 14c and an output level stabilized voltage 14b, are generated. The temperature signal generation voltage 14c is outputted to the image signal output terminal 7 via a horizontal selection switch 37, while the output level stabilized voltage 14b is output to a bias line 33.

In the thermal infrared solid-state imaging element according to the prior art, the output level stabilized voltage 14a is directly applied to the bias line 33 via the low-pass filter 11, a buffer amplifier 12, and the low-pass filter 13. However, since the output level stabilized voltage 14a applied to the bias line 33 is amplified by a differential integration circuit having a high degree of amplification (in many cases, a gain of 10 or more), and further amplified by an amplifier circuit inside a camera incorporated with the element, highly accurate setting is necessary. In addition, since a noise component included in the output level stabilized voltage 14a and a noise component included in a power supply voltage of a pixel driving power supply terminal 22 have a different phase relationship, there is such a problem that it is difficult to obtain a common mode noise suppression effect in the differential integration circuit 34. In addition, when acquiring substrate temperature information, it is necessary to read a bias voltage by the A/D converter, which raises the risk of increase in a noise component in this mechanism. At the same time, an A/D converter and an information acquisition mechanism are required separately from that for image information acquisition, resulting in an increase in power consumption and an increase in circuit scale.

Figure 13:
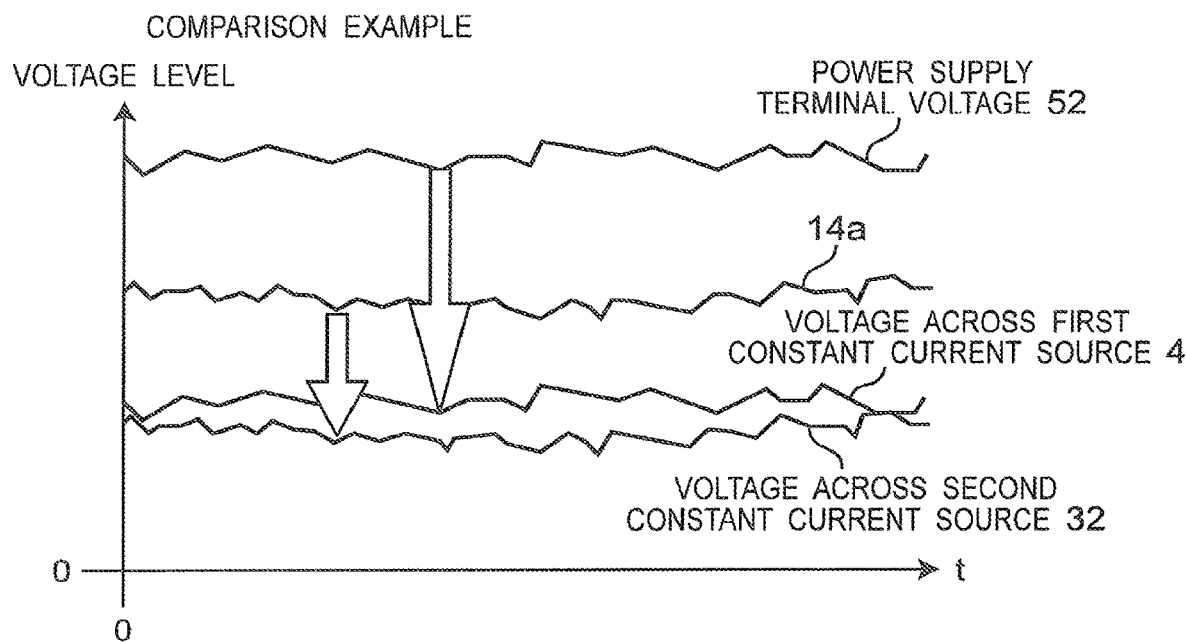
FIG. 13 is a chart showing a relationship between various voltage levels and an inherent noise component in a thermal infrared solid-state imaging element according to a comparison example, and is a schematic waveform chart showing a voltage level of each of terminals.

FIG. 13 is a chart showing a relationship between various voltage levels and an inherent noise component in a thermal infrared solid-state imaging element according to a comparison example, and is a schematic waveform chart showing a voltage level of each of terminals. In other words, FIG. 13 shows a relationship among a power supply terminal voltage 52 applied to the power supply terminal 22, the output level stabilized voltage 14a, a voltage across the first constant current source 4, and a voltage across a second constant current source 32.

As is apparent from FIG. 13, since the output level stabilized voltage 14a changes in accordance with a substrate temperature, the substrate temperature is strongly influenced by an ambient temperature and is also influenced by slight temperature changes such as an element operation cycle. In addition, various noises are also applied to a circuit of a path leading to the bias line 33 including the bias generating circuit 9 and the buffer amplifier 12. Similarly, in the power supply terminal voltage 52 applied to the power supply terminal 22, a noise component also exists. In this case, the noise components existing in the output level stabilized voltage 14a and the power supply terminal voltage 52 are not necessarily synchronized with each other.

Next, the two types of voltage signals applied to the differential integration circuit 34, that is, the voltage across the first constant current source 4 and the voltage across the second constant current source 32 will be described below.

The voltage across the first constant current source 4 is generated from the power supply terminal voltage 52 via wiring of a vertical scanning circuit 1, a driving line 30, a diode 100, and the signal line 31. Since a voltage drop occurs in each of the paths, a voltage level across the first constant current source 4 becomes lower than that of the power supply terminal voltage 52. In addition, the voltage across the first constant current source 4 has a synthesized noise of the noise component in each of the paths and the noise component inherent in the power supply terminal voltage 52.

The voltage across the second constant current source 32 is generated from the output level stabilized voltage 14a via the bias line 33. A voltage level of the second constant current source 32 becomes lower than that of the output level stabilized voltage 14a. In addition, the voltage across the second constant current source 32 has a synthesized noise of the noise component that generates in the bias line 33 and the noise component inherent in the output level stabilized voltage 14a.

In other words, also in the two types of voltage signals applied to the differential integration circuit 34, that is, in the voltage across the first constant current source 4 and the voltage across the second constant current source 32, the noise components are not synchronized with each other, and a sum of the noise of the two types of signals is outputted in the output voltage from the differential integration circuit 34. The thermal infrared solid-state imaging element according to the present embodiment solves these problems and will be described in detail below.

Figure 14:
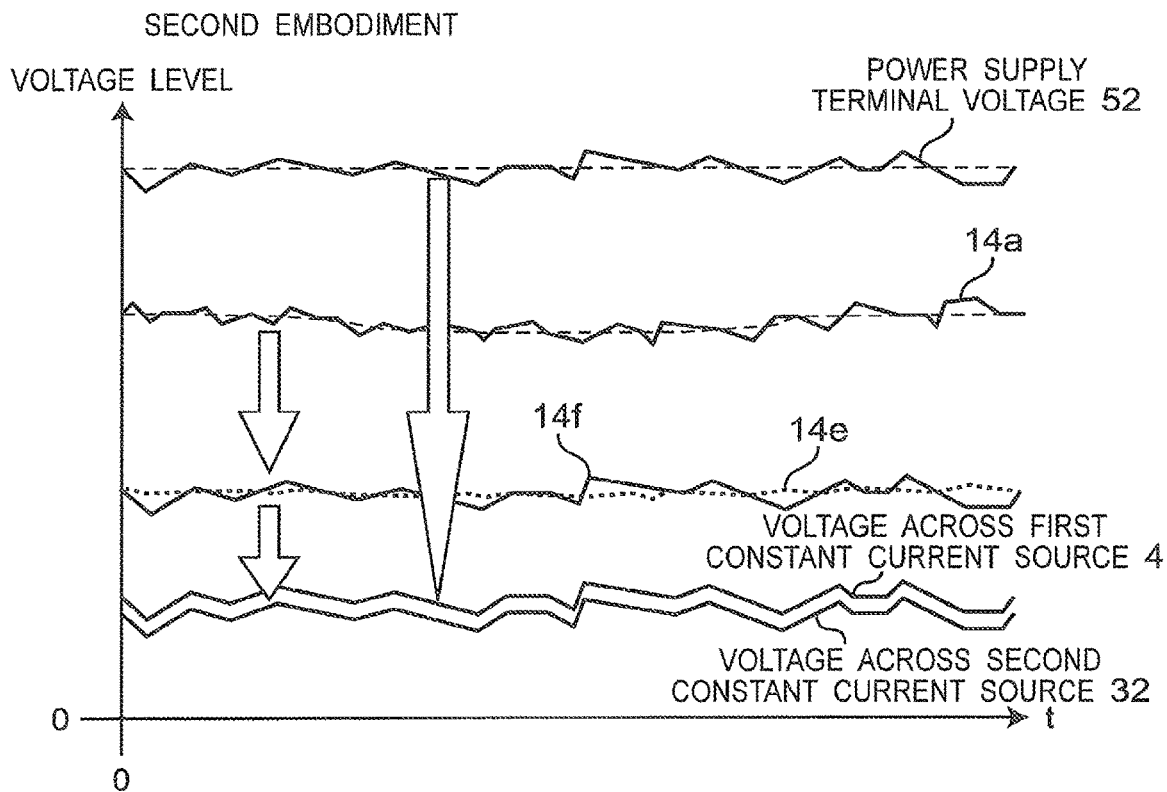
FIG. 14 is a schematic waveform chart showing an output voltage level of the voltage generating circuit 14A of FIG. 6A.

FIGS. 6A to 6D are block diagrams showing a configuration example of the voltage generating circuit 14A of FIG. 5 according to the first to fourth implementation examples, respectively. In addition, FIG. 14 is a schematic waveform chart showing an output voltage level of the voltage generating circuit 14A of FIG. 6A.

Figure 6A:
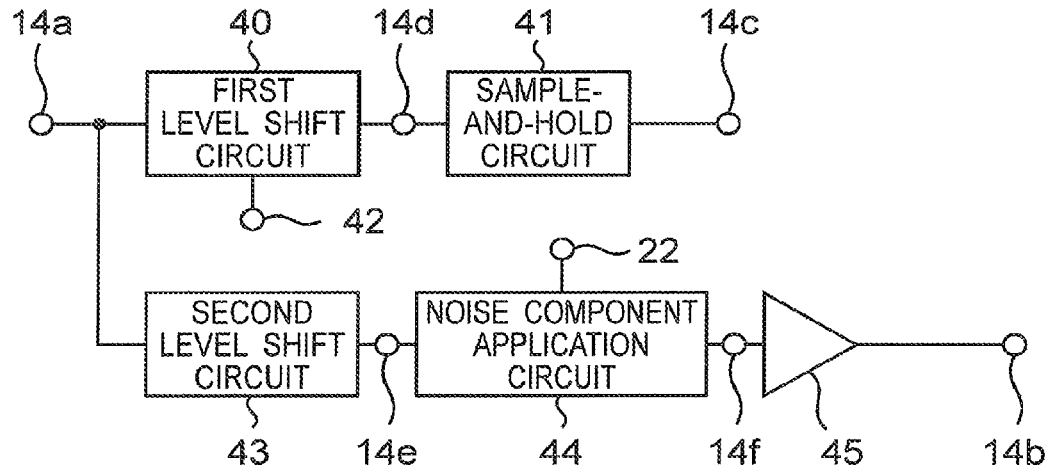
FIG. 6A is a block diagram showing a configuration example of a voltage generating circuit 14A of FIG. 5 according to the first implementation example.

The voltage generating circuit 14A of FIG. 6A is configured to include a first level shift circuit 40, a sample-and-hold circuit 41, a second level shift circuit 43, a noise component application circuit 44, and a buffer amplifier 45. Referring to FIG. 6A, the output level stabilized voltage 14a is inputted to the first level shift circuit 40 and the second level shift circuit 43. The voltage output from the first level shift circuit 40 is subjected to voltage stabilization by the sample-and-hold circuit 41 in a manner similar to that of the first embodiment, and is generated as the temperature signal generation voltage 14c. The temperature signal generation voltage 14c is outputted to the image signal output terminal 7 via the horizontal selection switch 37.

At the same time, in the voltage generating circuit 14A of FIG. 6A, the output level stabilized voltage 14a is level-shifted by the second level shift circuit 43 to generate a second generated voltage 14e. In this case, by setting a circuit gain (a gain of the output level stabilized voltage 14b with respect to the input voltage) in the second level shift circuit 43 to more than 0 and 1 or less, the noise component inherent in the output level stabilized voltage 14a is suppressed. The second generated voltage 14e is inputted to the noise component application circuit 44, and a noise component inherent in the power supply terminal voltage 52 is applied from the power supply terminal 22, generating a third generated voltage 14f. The third generated voltage 14f is output via the buffer amplifier 45, and the buffer amplifier 45 generates the output level stabilized voltage 14b, and outputs to the bias line 33. These circuit configurations consequently suppress the noise component inherent in the output stabilized voltage 14a in the output level stabilized voltage 14b, and applies a noise component synchronized with the power supply terminal voltage 52, which is a power supply voltage (hereinafter, referred to as a driving power supply voltage) that drives a photosensitive pixel 2 of a photosensitive pixel array 2A.

Two types of voltage signals applied to the differential integration circuit 34, that is, the voltage across the first constant current source 4 and the voltage across the second constant current source 32 are determined by the power supply terminal voltage 52 and the output level stabilized voltage 14b. Therefore, these two types of voltage signals have a noise component synchronized with the driving power supply voltage. Since the output voltage of the differential integration circuit 34 has an effect of canceling a noise component synchronized with the driving power supply voltage, a common mode noise suppression effect can be obtained. As a result, the noise component at the image signal output terminal 7 is to be suppressed.

In this case, it is preferable that a circuit gain (a gain of the output level stabilized voltage 14b with respect to the input voltage) in a current path from the second level shift circuit 43 to the buffer amplifier 45 is set to be more than 0 and 1 or less. This suppresses the noise component inherent in the output level stabilized voltage 14a, and consequently suppresses the noise component in the image signal output terminal 7. At the same time, if a setting accuracy of the output level stabilized voltage 14a in this configuration is similar to that of the output level stabilized voltage 14a in the conventional thermal infrared solid-state imaging element, the output level stabilized voltage 14b applied to the bias line 33 becomes highly accurate by the reciprocal of the circuit gain of the voltage generating circuit 14A.

In addition, since the configurations of the first level shift circuit 40 and the sample-and-hold circuit 41 are the same as those of the first embodiment, temperature information can be acquired by an A/D converter same as that for image acquisition, maintaining the effect of not increasing the power consumption and not increasing the circuit scale. At the same time, the image information and the temperature information are synchronously outputted, also maintaining the effect of facilitating various corrections in the signal processing circuit.

It should be noted that the voltage generating circuit 14A according to the present embodiment is not limited to the circuit configuration shown in FIG. 6A, as long as the voltage generating circuit 14A has a function of, based on the output level stabilized voltage 14a, generating the temperature signal generation voltage 14c, which is a stable voltage level-shifted within the pixel signal output range, and a function of, based on the output level stabilized voltage 14a, generating the output level stabilized voltage 14b that is applied with a noise component synchronized with the driving power supply voltage inputted to the power supply terminal 22 and has a fluctuation width subjected to attenuation processing. A modified embodiment will be described below.

Figure 6B:
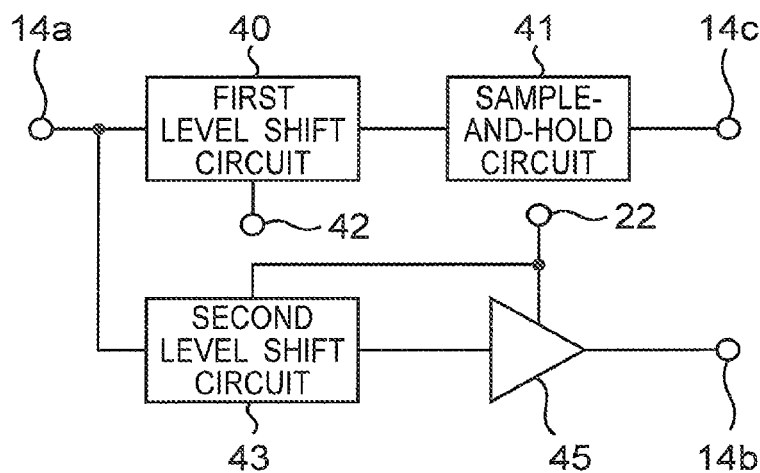
FIG. 6B is a block diagram showing a configuration example of a voltage generating circuit 14A of FIG. 5 according to the second implementation example.

For example, as shown in FIG. 6B, in the second level shift circuit 43 and the buffer amplifier 45, the noise component application circuit 44 may be omitted by providing a function of the noise component application circuit 44 of FIG. 6A, which is to apply the noise component from the power supply terminal 22.

Figure 6C:
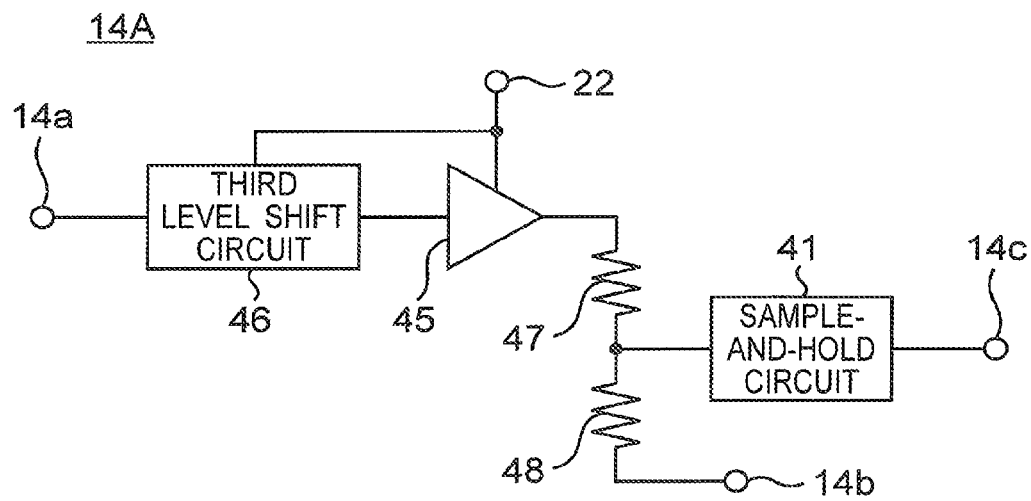
FIG. 6C is a block diagram showing a configuration example of a voltage generating circuit 14A of FIG. 5 according to the third implementation example.

In addition, for example, as shown in FIG. 6C, the output stabilized voltage 14a is inputted to a third level shift circuit 46, and a voltage obtained from the output voltage from the third level shift circuit 46 via the buffer amplifier 45 is resistively divided by a first resistor 47 and a second resistor 48. A voltage obtained at a connection point of the first resistor 47 and the second resistor 48 is sampled and held by the sample-and-hold circuit 41, to provide the temperature signal generation voltage 14c. In addition, a voltage obtained from an output voltage of the buffer amplifier 45 via the first resistor 47 and the second resistor 48 is generated as the output level stabilized voltage 14b. These methods can provide the temperature signal generation voltage 14c and the output level stabilized voltage 14b, and also simplify the circuit configuration of the voltage generating circuit 14A as compared with the circuits of FIGS. 6A and 6B.

Figure 6D:
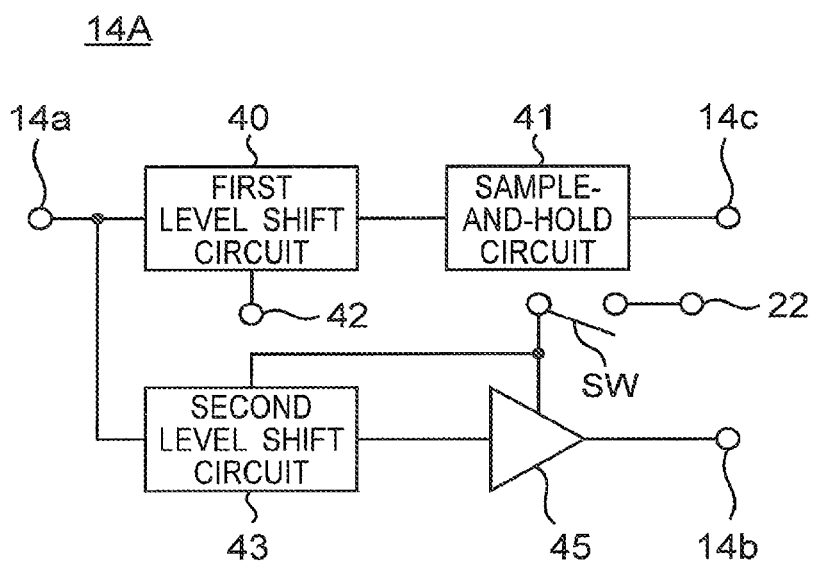
FIG. 6D is a block diagram showing a configuration example of a voltage generating circuit 14A of FIG. 5 according to the fourth implementation example.

Further, as shown in FIG. 6D, a switch SW may be additionally inserted between the power supply terminal 22, and the second level shift circuit 43 and the buffer amplifier 45, as compared with the voltage generating circuit 14A of FIG. 6B. As a result, the voltages applied to the second level shift circuit 43 and the buffer amplifier 45 may be ON/OFF controlled by the switch SW based on a predetermined control signal. At this time, it is preferable that the ON timing is a timing at which infrared detection is being performed (an integration interval of the differential integration circuit 34 of FIG. 1 or the like, which is a drive timing of the voltage generating circuit 14A of FIG. 6D), that is, synchronized with a vertical selection switch 35. This causes power consumption in the voltage generating circuit 14A to be limited only to the ON interval, providing a power consumption suppression effect.

In addition, as shown in FIG. 5, if the voltage generating circuit 14A has a buffer function, it is sufficient to insert only the low-pass filter 11 between the bias generating circuit 9 and the voltage generating circuit 14A, eliminating necessity of the buffer amplifier 12 and the low-pass filter 13. This enables removal of the noise component that generates in the buffer amplifier 12 in the output level stabilized voltage 14a, providing effect of reducing noise in the output signal. At the same time, power consumption in the buffer amplifier 12 becomes unnecessary, enabling low power consumption and suppression of manufacturing cost.

As described above, according to the second embodiment and its modified embodiment, based on the bias voltage and the input voltage from the power supply terminal 22, the voltage generating circuit 14A generates and adds the temperature signal generation voltage 14c to the image signal output terminal 7, and generates and applies the output level stabilized voltage 14b to the bias line 33. Therefore, the second embodiment and its modified embodiment have the function and effect similar to the first embodiment, and it is possible to add a noise component having the same phase as a driving voltage of the photosensitive pixel to the output level stabilized voltage 14b, and effectively provide the common mode noise suppression effect in the differential integration circuit 34.

In addition, for example, as shown in FIG. 6D, the voltage generating circuit 14 is configured to be driven during the integration interval of the differential integration circuit 34. Therefore, the power consumption in the voltage generating circuit 14 is limited only to the ON interval, providing a power consumption suppression effect.

Further, as shown in FIGS. 5 and 6A to 6D of the second embodiment, the output level stabilized voltage 14b includes a noise component synchronized with the driving power supply voltage that drives the photosensitive pixel 2. Therefore, by adding a noise component having the same phase as the driving power supply voltage to the output level stabilized voltage 14b, the common mode noise suppression effect in the differential integration circuit 34 can be effectively obtained.

Furthermore, according to the second embodiment, the circuit gain of the output level stabilized voltage 14b with respect to the input voltage in the voltage generating circuit 14 is set to be more than 0 and 1 or less. This can enhance controllability of the output level stabilized voltage 14b and suppress the influence of the noise component included in the output level stabilized voltage 14b on the pixel output signal.

Furthermore, according to the second embodiment, there is provided the low-pass filter 11, that low-pass filters the bias voltage from the bias generating circuit 9, and outputs the bias voltage to the voltage generating circuit 14. Therefore, when providing the buffer function to the voltage generating circuit 14, it is sufficient to provide only the low-pass filter 11 between the bias generating circuit 9 and the voltage generating circuit 14, eliminating necessity of the buffer amplifier 12 and the low-pass filter 13 of FIG. 1. This enables removal of the noise component that generates in the buffer amplifier 12 in the output level stabilized voltage 14a, providing effect of reducing noise in the output signal.

Third Embodiment

Figure 7A:
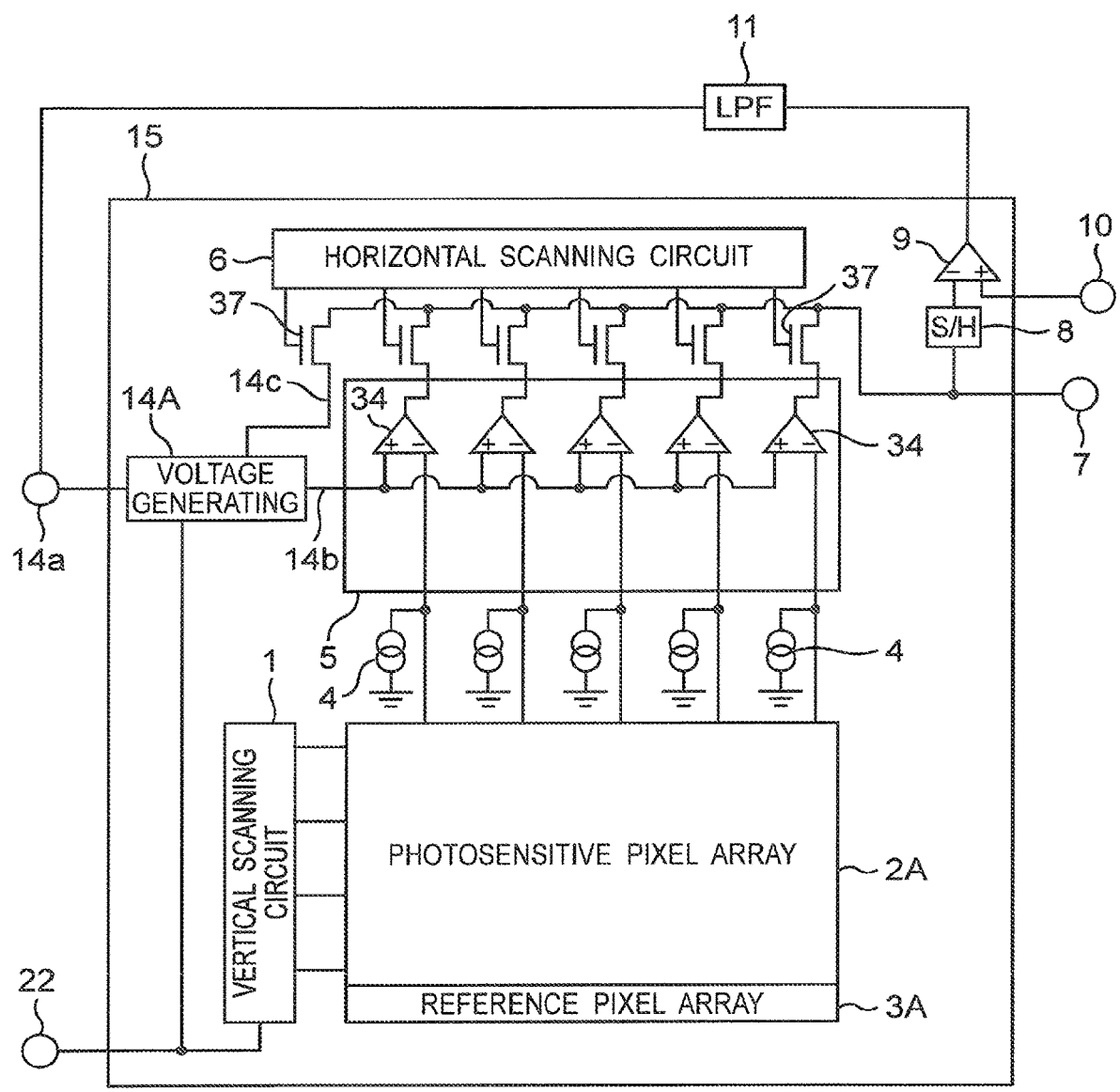
FIG. 7A is a circuit diagram showing a configuration example of a thermal infrared solid-state imaging element according to a third embodiment of the present invention.
Figure 7B:
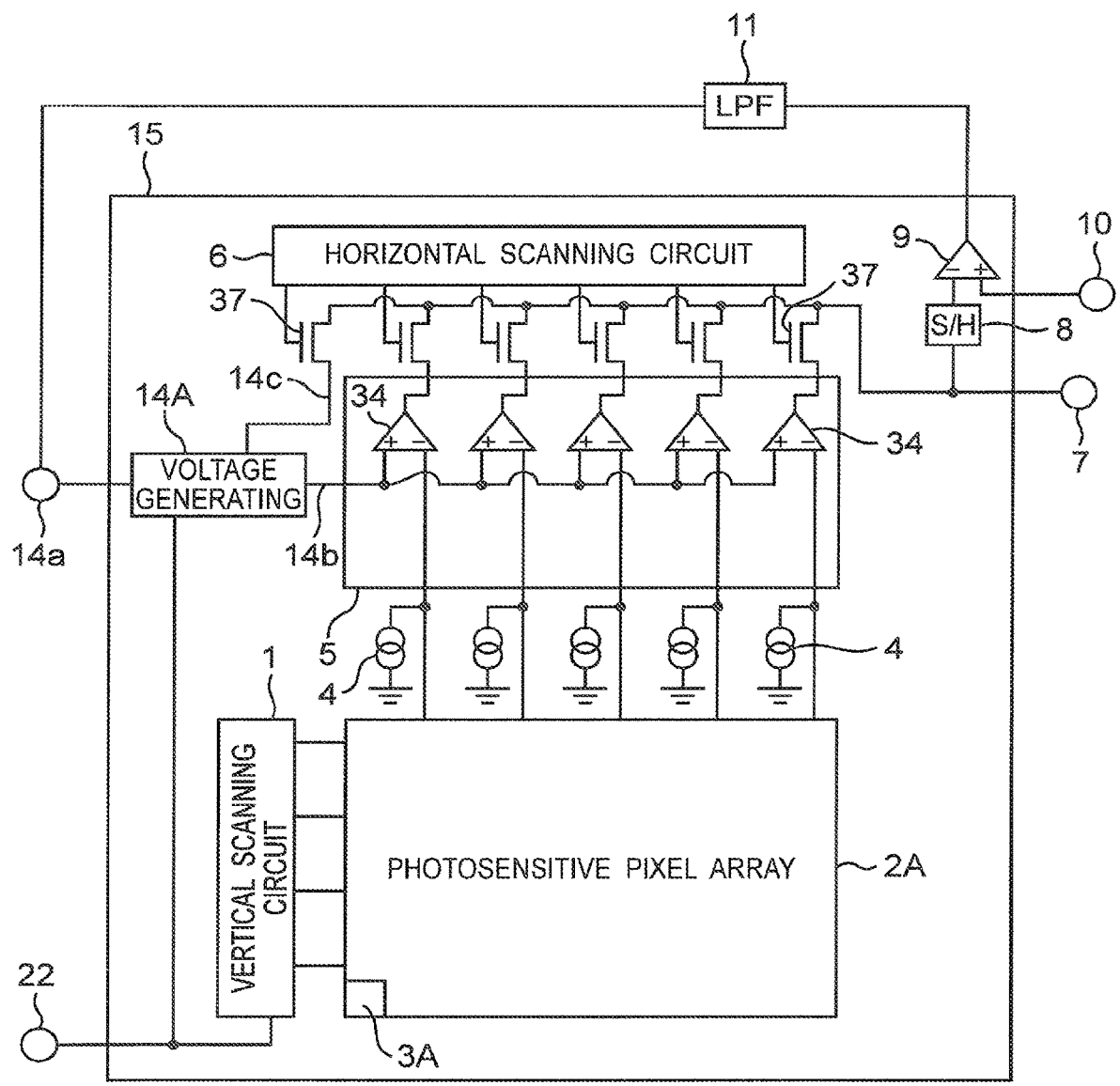
FIG. 7B is a circuit diagram showing a configuration example of a thermal infrared solid-state imaging element according to a first modified embodiment of the third embodiment of the present invention.
Figure 7C:
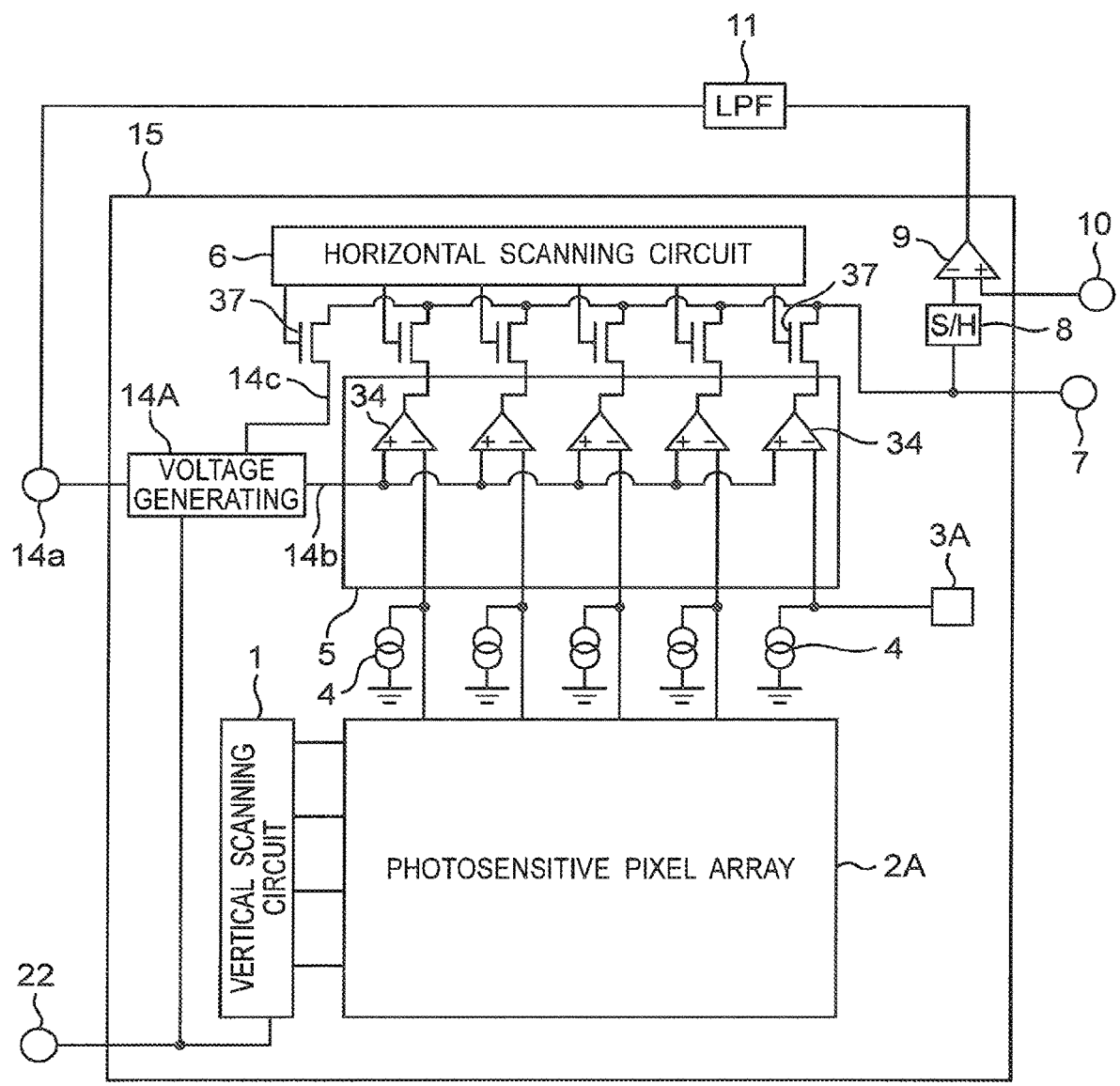
FIG. 7C is a circuit diagram showing a configuration example of a thermal infrared solid-state imaging element according to a second modified embodiment of the third embodiment of the present invention.

FIG. 7A is a circuit diagram showing a configuration example of a thermal infrared solid-state imaging element according to a third embodiment of the present invention. In addition, FIG. 7B is a circuit diagram showing a configuration example of a thermal infrared solid-state imaging element according to a first modified embodiment of the third embodiment of the present invention. Further, FIG. 7C is a circuit diagram showing a configuration example of a thermal infrared solid-state imaging element according to a second modified embodiment of the third embodiment of the present invention.

The reference pixel array 3A described in the first and second embodiments is not limited to the one column on the right side as shown in FIG. 1, as long as a temperature of a reference pixel 3 is equivalent to a temperature of a photosensitive pixel 2 of a photosensitive pixel array 2A. For example, as shown in FIG. 7A, a reference pixel array 3A may be arranged as one row on a lower side, or may be arranged at any one pixel as shown in FIG. 7B. In addition, when it can be determined that the temperature is the same as the temperature of the photosensitive pixel array 2A, or the temperature difference is sufficiently small, the reference pixel array 3A may be arranged outside the photosensitive pixel array 2A as shown in FIG. 7C.

In both cases of FIG. 1 and FIGS. 7A to 7C, by sampling and holding at a timing corresponding to an output from the reference pixel 3 in the sample-and-hold circuit 8, it is possible to obtain the same effect as in the first and third embodiments.

In addition, averaging signal voltages of pixel signals from a plurality of the photosensitive pixels 2 allows stabilization of the output level stabilized voltage 14a, and consequently, the effect of obtaining a stabilized output level of the image signal can be obtained.

Fourth Embodiment

Figure 8A:
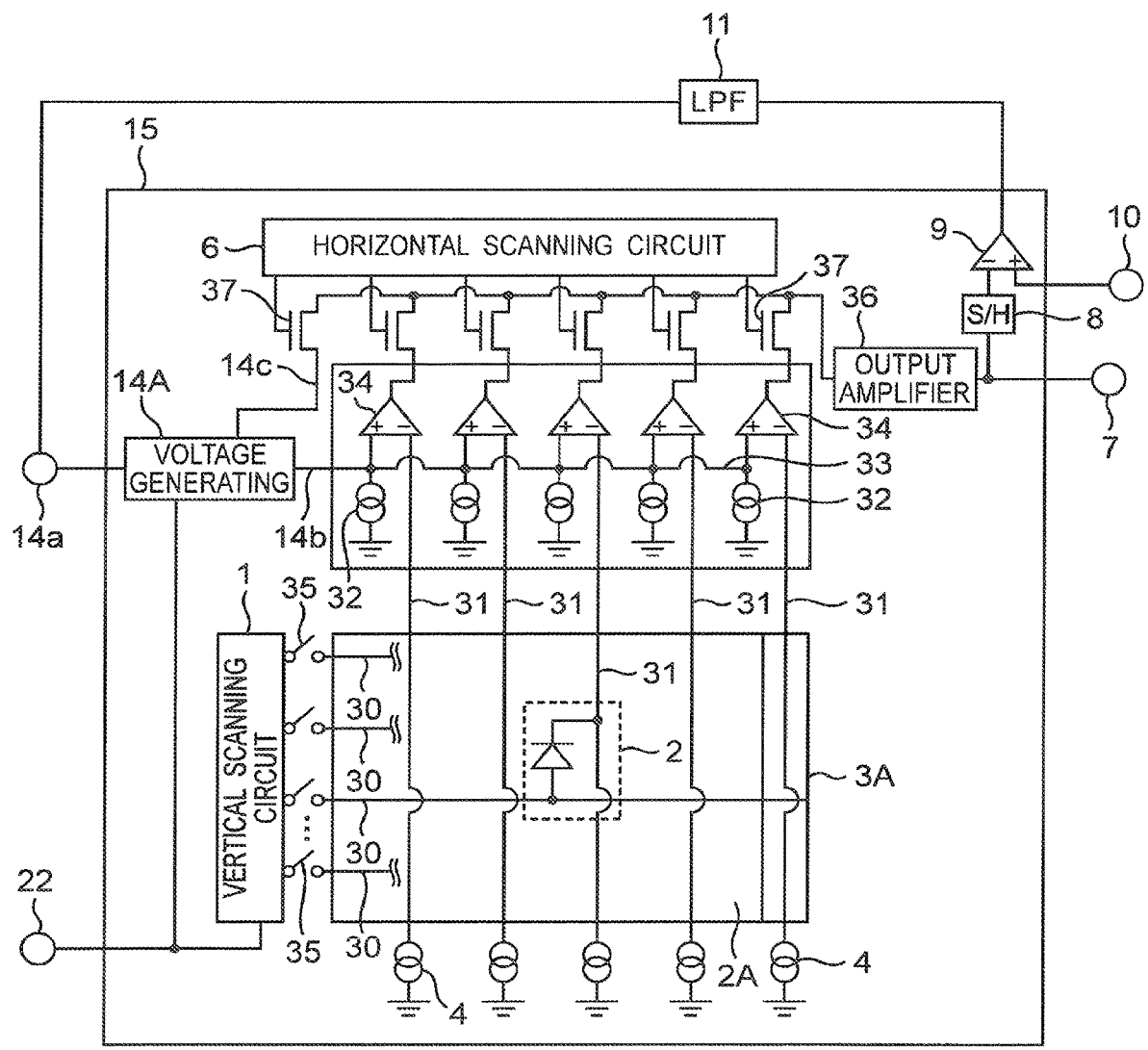
FIG. 8A is a circuit diagram showing a configuration example of a thermal infrared solid-state imaging element according to a fourth embodiment of the present invention.

FIG. 8A is a circuit diagram showing a configuration example of a thermal infrared solid-state imaging element according to a fourth embodiment of the present invention. In addition, FIG. 8B is a circuit diagram showing a configuration example of a thermal infrared solid-state imaging element according to a modified embodiment of the fourth embodiment of the present invention.

The first constant current source 4 of FIG. 1 shown in the first embodiment and in FIG. 5 shown in the second embodiment is provided at the end of each of the signal lines 31, but the present invention is not limited to such an arrangement. Specifically, as shown in FIG. 8A, a first constant current source 4 may be provided at a position opposed to a second constant current source 32 with a photosensitive pixel 2 interposed therebetween. With this arrangement method, a voltage at a connection point of the photosensitive pixel 2 to the signal line 31 is inputted to the differential integration circuit 34. In other words, the voltage signal inputted to the differential integration circuit 34 in FIGS. 1 and 5 includes a voltage drop component in the signal line 31, but the voltage drop component is not included in this configuration. Since it is possible to obtain an output voltage of a pixel signal from which variation components such as a manufacturing variation and a voltage drop amount change when a temperature component changes are removed, the pixel signal level can be stabilized.

Figure 8B:
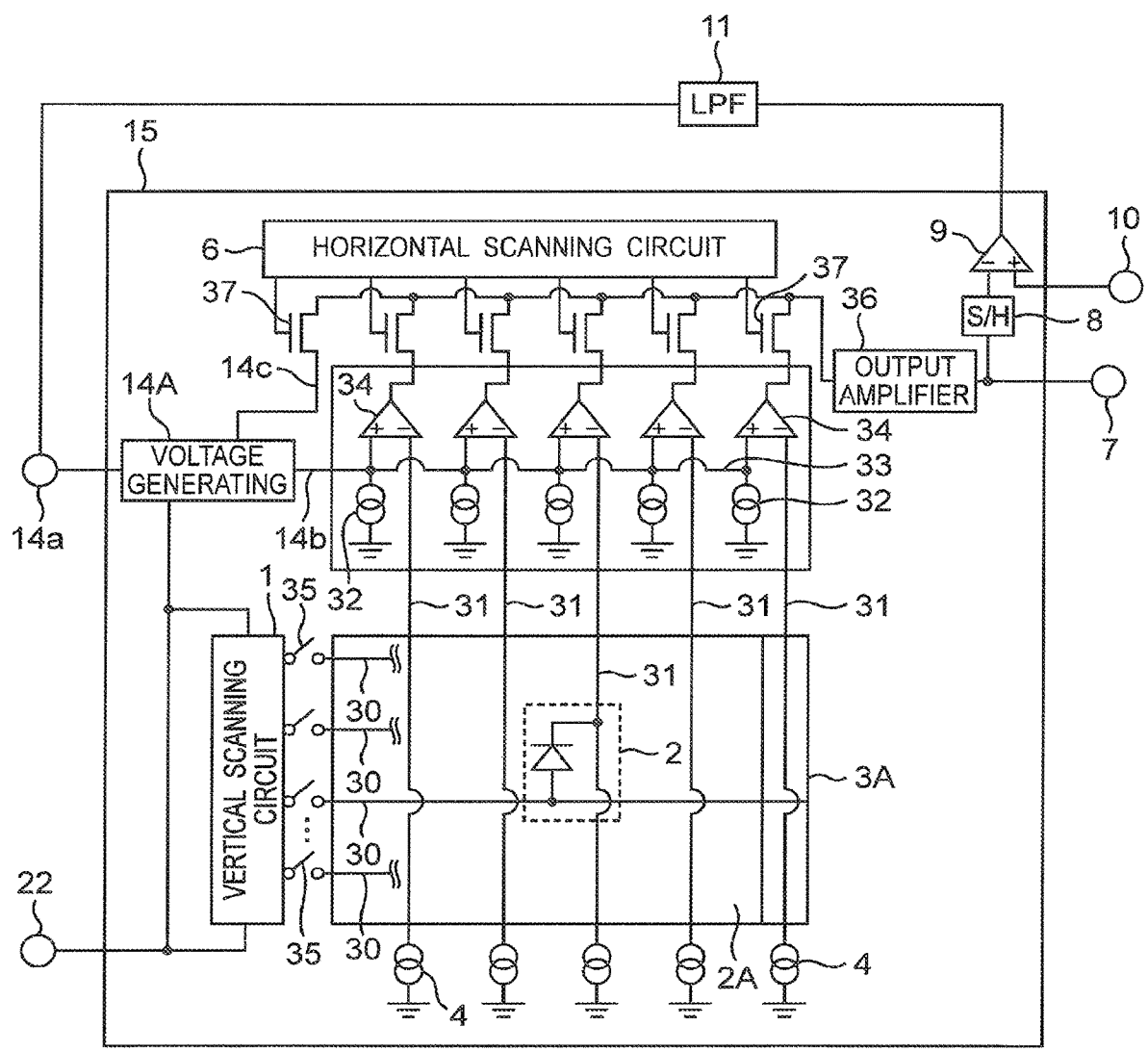
FIG. 8B is a circuit diagram showing a configuration example of a thermal infrared solid-state imaging element according to a modified embodiment of the fourth embodiment of the present invention.

At this time, as shown in the modified embodiment of FIG. 8B, the voltage from the power supply terminal 22 may be inputted from upper and lower ends of a vertical scanning circuit 1. This circuit configuration enhances uniformity of the voltage inputted to the driving line 30 in each of rows, so that the pixel signal level can be stabilized. It should be noted that, although the input is from the upper and lower two points of FIG. 8B, the present invention is not limited to this. The pixel signal level can be further stabilized by including the input in the middle of the vertical scanning circuit 1 and allowing multi-point input.

As described above, according to the fourth embodiment and its modified embodiment, the first constant current source 4 and the second constant current source 32 are provided so as to sandwich a photosensitive pixel array 2A. Therefore, the voltage signal inputted to the differential integration circuit 34 does not include the voltage drop component in the signal line 31. As a result, since it is possible to output a pixel signal from which variation components such as a manufacturing variation and a voltage drop amount change when a temperature component changes are removed, the output signal can be stabilized.

Fifth Embodiment

Figure 9:
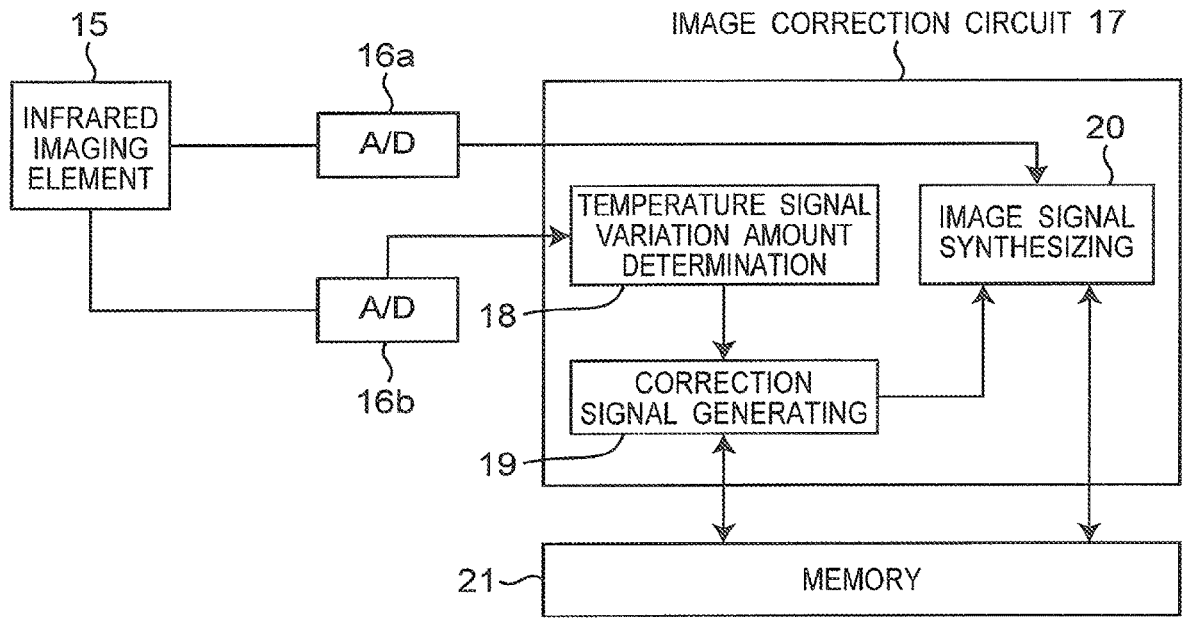
FIG. 9 is a block diagram showing a configuration example of an image correction circuit of a thermal infrared solid-state imaging element according to a comparison example.

FIG. 9 is a block diagram showing a configuration example of an image correction circuit of a thermal infrared solid-state imaging element according to a comparison example. Referring to FIG. 9, an image correction circuit 17 is configured to include a temperature signal variation amount determination circuit 18, a correction signal generating circuit 19, and an image signal synthesizing circuit 20, and a memory 21 that holds correction data according to a temperature change is connected to the correction signal generating circuit 19 and the image signal synthesizing circuit 20 in advance. That is, in FIG. 9, there is an image signal A/D converter 16a as means to read an image signal, and there is a temperature signal A/D converter 16b as means to read a temperature signal. In this case, based on the output signal of the temperature signal A/D converter 16b, the temperature signal variation amount determination circuit 18 determines a substrate temperature, and outputs the determination result to the correction signal generating circuit 19. The correction signal generating circuit 19 generates a correction signal based on the input determination result and correction data from the memory 21, and outputs the correction signal to the image signal synthesizing circuit 20. The image signal synthesizing circuit 20 corrects the image signal read out by the image signal A/D converter 16a using the correction signal, to synthesize and output the corrected image signal. Accordingly, a stable image output can be obtained even when the temperature changes.

Figure 10:
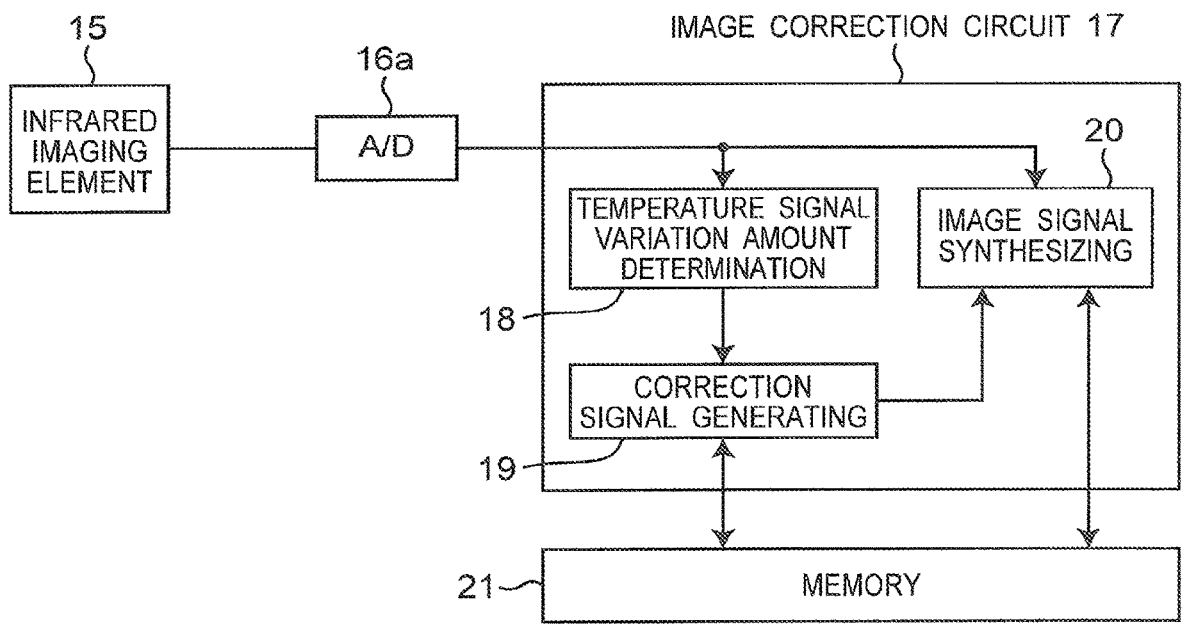
FIG. 10 is a block diagram showing a configuration example of a correction circuit of a thermal infrared solid-state imaging element according to a fifth embodiment of the present invention.

FIG. 10 is a block diagram showing a configuration example of an image correction circuit of a thermal infrared solid-state imaging element according to a fifth embodiment of the present invention.

With the circuit configuration of the thermal infrared solid-state imaging element of FIG. 1 shown in the first embodiment and shown in the second embodiment, a temperature signal can be added to the pixel signal. Therefore, the temperature signal A/D converter 16b can be omitted as compared with the comparison example of FIG. 9, as shown in FIG. 10. As a result, the image correction circuit 17 can collectively determine the image signal and the temperature signal based on the image signal read out from the image signal A/D converter 16a. Therefore, it is possible to suppress the risk of increasing the noise component, and to prevent an increase in power consumption and manufacturing cost and an increase in circuit scale. In addition, accurate acquisition of temperature information becomes possible by using the image signal A/D converter 16a configured to include a highly accurate A/D converter. In addition, the same temperature as that of the pixel array can be measured as the temperature signal, allowing accurate acquisition of temperature information.

In addition, in the image correction circuit according to the fifth embodiment shown in FIG. 10, an image signal is corrected and synthesized by using the temperature signal variation amount determination circuit 18, the memory 21, the correction signal generating circuit 19, and the image signal synthesizing circuit 20, in a manner similar to that of FIG. 9. With this configuration, it is possible to improve the effect of obtaining a stable image output even when the temperature changes, and to prevent an increase in power consumption and manufacturing cost and an increase in circuit scale.

It is also possible to configure an infrared imaging element provided with the image correction circuit of FIG. 10, and an infrared camera that performs predetermined image signal processing on an image signal from the infrared imaging element, and stores image signal data in an image memory. As a result, by adjusting the image signal outputted from the infrared imaging element in the image correction circuit of FIG. 10 as described above based on the temperature information included in the infrared imaging element, it is possible to obtain an image having constant uniformity regardless of a change in an ambient temperature. That is, it is possible to improve the effect of obtaining a stable output of an image signal even when the temperature changes, and to prevent an increase in power consumption and manufacturing cost and an increase in circuit scale.

INDUSTRIAL APPLICABILITY

As mentioned above in detail, according to the present invention, it is possible to generate an image signal including a temperature signal generation voltage. Therefore, for example, it is possible to acquire temperature information by the A/D converter same as that for acquisition of an image signal, resulting in neither an increase in power consumption nor an increase in circuit scale. At the same time, both the image information and the temperature information are outputted, facilitating various image corrections in an image signal processing circuit in a subsequent stage.

DESCRIPTION OF REFERENCE CHARACTERS

1: VERTICAL SCANNING CIRCUIT
2: PHOTOSENSITIVE PIXEL
2A: PHOTOSENSITIVE PIXEL ARRAY
3: REFERENCE PIXEL
3A: REFERENCE PIXEL ARRAY
4: FIRST CONSTANT CURRENT SOURCE
5: READOUT CIRCUIT
6: HORIZONTAL SCANNING CIRCUIT
7: IMAGE SIGNAL OUTPUT TERMINAL
8: SAMPLE-AND-HOLD CIRCUIT
9: BIAS GENERATING CIRCUIT
10: REFERENCE VOLTAGE
11: LOW-PASS FILTER
14, 14A: VOLTAGE GENERATING CIRCUIT
14a: OUTPUT LEVEL STABILIZED VOLTAGE
14b: OUTPUT LEVEL STABILIZED VOLTAGE
14c: TEMPERATURE SIGNAL GENERATION VOLTAGE
14d: FIRST GENERATED VOLTAGE
14e: SECOND GENERATED VOLTAGE
14f: THIRD GENERATED VOLTAGE
15: THERMAL INFRARED SOLID-STATE IMAGING ELEMENT
16a: IMAGE SIGNAL A/D CONVERTER
16b: TEMPERATURE SIGNAL A/D CONVERTER
17: IMAGE CORRECTION CIRCUIT
18: TEMPERATURE SIGNAL VARIATION AMOUNT DETERMINATION CIRCUIT
19: CORRECTION SIGNAL GENERATING CIRCUIT
20: IMAGE SIGNAL SYNTHESIZING CIRCUIT
21: MEMORY
22: POWER SUPPLY TERMINAL
30: DRIVING LINE
31: SIGNAL LINE
32: SECOND CONSTANT CURRENT SOURCE
33: BIAS LINE

34: DIFFERENTIAL INTEGRATION CIRCUIT
35: VERTICAL SELECTION SWITCH
36: OUTPUT AMPLIFIER
37: HORIZONTAL SELECTION SWITCH
40: FIRST LEVEL SHIFT CIRCUIT
41: SAMPLE-AND-HOLD CIRCUIT
42: LEVEL SHIFT AMOUNT ADJUSTMENT VOLTAGE
43: SECOND LEVEL SHIFT CIRCUIT
44: NOISE COMPONENT APPLICATION CIRCUIT
45: BUFFER AMPLIFIER
46: THIRD LEVEL SHIFT CIRCUIT
47: FIRST RESISTOR
48: SECOND RESISTOR
50: PIXEL SIGNAL
51: OPERATION INTERVAL SIGNAL
52: POWER SUPPLY TERMINAL VOLTAGE
100: DIODE
101: INFRARED RAY ABSORPTION MEMBER
102: HEAT INSULATING LAYER
103: SUPPORTING LEG
104: INFRARED RAY SHIELDING LAYER
SW: SWITCH

The invention claimed is:

1. An infrared imaging element comprising:
a photosensitive pixel array having a heat insulating layer and an infrared ray absorption member, the photosensitive pixel array including a plurality of photosensitive pixels arranged in a two-dimensional shape;
a driving line commonly connected with one pole of each of the photosensitive pixels for each of rows;
a vertical scanning circuit that sequentially selects the driving line to connect the driving line to a power supply;
a signal line commonly connected with another pole of each of the photosensitive pixels for each of columns, the signal line having an end part connected with first constant current source;
a bias line that is connected in parallel with second constant current source provided for each of the columns of the photosensitive pixel array, the bias line generating a voltage drop substantially identical to that of the driving line;
a differential integration circuit provided for each of the columns of the photosensitive pixel array, the differential integration circuit time-integrating and outputting a difference between a voltage across the first constant current source and a voltage across the second constant current source with a predetermined integration time; and
a horizontal scanning circuit that selects an output signal of the differential integration circuit for each of the columns to guide the output signal to an image signal output terminal as an image signal,
wherein the infrared imaging element further comprises:
a reference pixel array that outputs a reference signal that changes substantially in accordance with a change in a temperature of a whole of the plurality of photosensitive pixels;
a bias generating circuit that generates a bias voltage for applying the bias voltage to the bias line, the bias voltage corresponding to a difference between a predetermined reference voltage and a differential signal between the reference signal and a voltage at a predetermined position on the bias line, and the bias voltage including a voltage component of an output level stabilized voltage; and
a voltage generating circuit that generates a predetermined temperature signal generation voltage based on the bias voltage, and adds the predetermined temperature signal generation voltage to the image signal output terminal,
wherein the temperature signal generation voltage is adjusted to become a predetermined voltage together with a voltage level of the image signal, and is configured to be added to the image signal at a timing different from that of the image signal.

2. The infrared imaging element as claimed in claim 1, wherein the voltage generating circuit generates the temperature signal generation voltage based on the bias voltage and an input voltage from a power supply terminal, and adds the temperature signal generation voltage to the image signal output terminal, and
wherein the voltage generating circuit also generates an output level stabilized voltage, and applies the output level stabilized voltage to the bias line.

3. The infrared imaging element as claimed in claim 2, wherein the output level stabilized voltage includes a noise component synchronized with a driving power supply voltage that drives the photosensitive pixels.

4. The infrared imaging element as claimed in claim 2, wherein a circuit gain of the output level stabilized voltage with respect to an input voltage in the voltage generating circuit is set to be more than 0 and 1 or less.

5. The infrared imaging element as claimed in claim 2, further comprising a low-pass filter that low-pass filters the bias voltage, and outputs the bias voltage to the voltage generating circuit.

6. The infrared imaging element as claimed in claim 1, wherein the reference pixel array is formed to remove either one or both of the heat insulating layer and the infrared ray absorption member, or is configured to have an infrared ray shielding layer.

7. The infrared imaging element as claimed in claim 1, wherein the photosensitive pixel array is formed to remove either one or both of the heat insulating layer and the infrared ray absorption member.

8. The infrared imaging element as claimed in claim 1, wherein the reference pixel array is formed to be adjacent to at least one side in a vertical direction or a horizontal direction of the photosensitive pixel array.

9. The infrared imaging element as claimed in claim 1, wherein the reference pixel array includes a plurality of reference pixels, and
wherein the infrared imaging element further comprises a sample-and-hold circuit that is provided in a preceding stage of the bias generating circuit, samples and holds pixel signals from the plurality of reference pixels after averaging the pixel signals, and outputs sampled and held pixel signals to the bias generating circuit.

10. The infrared imaging element as claimed in claim 1, wherein the first constant current source and the second constant current source are provided to sandwich the photosensitive pixel array.

11. The infrared imaging element as claimed in claim 1, wherein the voltage generating circuit is configured to be driven during an integration interval of the differential integration circuit.

12. An infrared camera comprising:
an infrared imaging element; and
an image correction circuit that corrects an output image signal to be constant based on an image signal, the image signal being outputted from the infrared imaging element and including the temperature signal generation voltage, wherein the infrared imaging element comprises:

a photosensitive pixel array having a heat insulating layer and an infrared ray absorption member, the photosensitive pixel array including a plurality of photosensitive pixels arranged in a two-dimensional shape;

a driving line commonly connected with one pole of each of the photosensitive pixels for each of rows;

a vertical scanning circuit that sequentially selects the driving line to connect the driving line to a power supply;

a signal line commonly connected with another pole of each of the photosensitive pixels for each of columns, the signal line having an end part connected with first constant current source;

a bias line that is connected in parallel with second constant current source provided for each of the columns of the photosensitive pixel array, the bias line generating a voltage drop substantially identical to that of the driving line;

a differential integration circuit provided for each of the columns of the photosensitive pixel array, the differential integration circuit time-integrating and outputting a difference between a voltage across the first constant current source and a voltage across the second constant current source with a predetermined integration time; and a horizontal scanning circuit that selects an output signal of the differential integration circuit for each of the columns to guide the output signal to an image signal output terminal as an image signal, and wherein the infrared imaging element further comprises:

a reference pixel array that outputs a reference signal changing substantially in accordance with a change in a temperature of a whole of the plurality of photosensitive pixels;

a bias generating circuit that generates a bias voltage for applying the bias voltage to the bias line, the bias voltage corresponding to a difference between a predetermined reference voltage and a differential signal between the reference signal and a voltage at a predetermined position on the bias line, and the bias voltage including a voltage component of an output level stabilized voltage; and a voltage generating circuit that generates a predetermined temperature signal generation voltage based on the bias voltage, and adds the predetermined temperature signal generation voltage to the image signal output terminal, wherein the temperature signal generation voltage is adjusted to become a predetermined voltage together with a voltage level of the image signal, and is configured to be added to the image signal at a timing different from that of the image signal.

* * * * *